(12) United States Patent
Rosti et al.

(10) Patent No.: US 11,829,691 B2
(45) Date of Patent: Nov. 28, 2023

(54) ATMOSPHERIC SENSOR NETWORK AND ANALYTICAL INFORMATION SYSTEM RELATED THERETO

(71) Applicant: Scepter Incorporated, San Francisco, CA (US)

(72) Inventors: Peter Rosti, Toluca Lake, CA (US); Philip Father, Belmont, CA (US); Alex Ramia, Northridge, CA (US)

(73) Assignee: SCEPTER INCORPORATED, San Francisco, CA (US)

( * ) Notice: Subject to any disclaimer, the term of this patent is extended or adjusted under 35 U.S.C. 154(b) by 0 days.

(21) Appl. No.: 17/670,828

(22) Filed: Feb. 14, 2022

(65) Prior Publication Data
US 2022/0414290 A1   Dec. 29, 2022

Related U.S. Application Data

(63) Continuation of application No. 16/821,718, filed on Mar. 17, 2020, now Pat. No. 11,281,822, which is a
(Continued)

(51) Int. Cl.
*H04W 84/06* (2009.01)
*H04W 4/38* (2018.01)
(Continued)

(52) U.S. Cl.
CPC .............. *G06F 30/20* (2020.01); *H04L 65/65* (2022.05); *H04W 4/38* (2018.02); *H04W 84/06* (2013.01)

(58) Field of Classification Search
CPC ........ H04W 4/38; H04W 84/06; H04L 65/65; G06G 30/20
See application file for complete search history.

(56) References Cited

U.S. PATENT DOCUMENTS

| 3,700,333 A | 10/1972 | Charlson et al. |
| 5,675,081 A * | 10/1997 | Solheim .................. G01W 1/00 73/170.28 |

(Continued)

FOREIGN PATENT DOCUMENTS

| TW | 200951888 A | 12/2009 |
| WO | 2014129966 A1 | 8/2014 |

OTHER PUBLICATIONS

W. A. Lahoz et al., "Monitoring Air Quality From Space", American Meteorological Society, Feb. 2012, pp. 211-233.
(Continued)

*Primary Examiner* — Dominic E Rego
(74) *Attorney, Agent, or Firm* — Greenberg Traurig, LLP

(57) ABSTRACT

Disclosed is an atmospheric information network comprised of a group of low earth orbit satellite-based sensors providing global coverage of the earth, together with one or more ground-based sensor networks, together with one or more mobile sensor networks, all operating to collect near-real-time or real-time data, together with data gathering from other governmental and commercial atmospheric data sources, together with software algorithms and processes for data reduction, data analysis, correlation of information, data fusion, modeling, reporting of near-real-time or real-time atmospheric conditions of air pollution and wind, and prediction of future atmospheric conditions of air pollution and wind. Such information is presented in geospatial and infographic formats on computer or mobile device displays, or electronic billboards.

19 Claims, 11 Drawing Sheets

Related U.S. Application Data continuation of application No. 15/343,185, filed on Nov. 3, 2016, now Pat. No. 10,642,943.

(60) Provisional application No. 62/250,894, filed on Nov. 4, 2015.

(51) Int. Cl.
*H04L 65/65* (2022.01)
*G06F 30/20* (2020.01)

(56) References Cited

U.S. PATENT DOCUMENTS

| | | | | |
|---|---|---|---|---|
| 6,067,852 | A * | 5/2000 | Alber | G01S 19/07 73/178 R |
| 6,112,151 | A | 8/2000 | Kruse | |
| 9,599,597 | B1 * | 3/2017 | Steele | G01M 3/04 |
| 2003/0222795 | A1 * | 12/2003 | Holforty | B64D 43/00 340/968 |
| 2004/0014491 | A1 * | 1/2004 | Weigand | H04L 5/0058 455/423 |
| 2004/0210391 | A1 * | 10/2004 | Kolodner | G01J 5/007 702/3 |
| 2005/0278120 | A1 * | 12/2005 | Manfred | G01W 1/08 702/2 |
| 2007/0050141 | A1 * | 3/2007 | Posey | G01W 1/10 702/3 |
| 2008/0045156 | A1 * | 2/2008 | Sakhpara | G01N 33/0063 455/66.1 |
| 2008/0065401 | A1 * | 3/2008 | Abrahamson | G06Q 30/018 705/317 |
| 2008/0208820 | A1 | 8/2008 | Usey et al. | |
| 2009/0214084 | A1 * | 8/2009 | Asner | G06V 20/188 382/110 |
| 2009/0265037 | A1 | 10/2009 | Bassa | |
| 2009/0309744 | A1 | 12/2009 | Fu et al. | |
| 2009/0322515 | A1 * | 12/2009 | Kirchner | G01S 19/02 340/601 |
| 2010/0081957 | A1 * | 4/2010 | Hyde | A61M 15/02 600/300 |
| 2010/0274542 | A1 * | 10/2010 | Krupansky | G01W 1/10 703/6 |
| 2011/0087387 | A1 | 4/2011 | Safa-Bakhsh et al. | |
| 2011/0195723 | A1 | 8/2011 | Kim et al. | |
| 2011/0246025 | A1 * | 10/2011 | Ishihara | G08G 1/20 701/36 |
| 2011/0295575 | A1 | 12/2011 | Levine et al. | |
| 2011/0295609 | A1 | 12/2011 | Koponen et al. | |
| 2012/0150918 | A1 * | 6/2012 | Blain | G06F 16/258 707/803 |
| 2012/0166022 | A1 * | 6/2012 | Kwon | G01N 33/0075 701/2 |
| 2012/0242488 | A1 * | 9/2012 | Wilson | G08B 21/10 340/601 |
| 2012/0293315 | A1 | 11/2012 | Schunder et al. | |
| 2012/0297028 | A1 | 11/2012 | Das et al. | |
| 2013/0080053 | A1 | 3/2013 | Rakshit | |
| 2013/0110400 | A1 * | 5/2013 | Moshe | G01N 1/26 702/3 |
| 2013/0122489 | A1 * | 5/2013 | Stupi | C07H 19/14 435/6.1 |
| 2013/0298030 | A1 | 11/2013 | Nuhumi et al. | |
| 2013/0299000 | A1 | 11/2013 | Gillette, II | |
| 2013/0328862 | A1 | 12/2013 | Piemonte | |
| 2014/0153482 | A1 | 6/2014 | Schmidt et al. | |
| 2014/0229255 | A1 | 8/2014 | Scofield et al. | |
| 2014/0297299 | A1 | 10/2014 | Lester, IV | |
| 2015/0081124 | A1 * | 3/2015 | Ekanayake | G06Q 10/0631 700/291 |
| 2015/0339811 | A1 * | 11/2015 | Zhong | G06T 7/0002 382/104 |
| 2015/0360740 | A1 | 12/2015 | Sarvestani | |
| 2016/0078778 | A1 | 3/2016 | Holland | |
| 2016/0113569 | A1 | 4/2016 | Zhao et al. | |
| 2016/0142654 | A1 | 5/2016 | Vaillancourt | |
| 2016/0370339 | A1 * | 12/2016 | Liu | G01N 33/0075 |
| 2017/0005410 | A1 * | 1/2017 | Beens | H01Q 9/0421 |

OTHER PUBLICATIONS

International Search Report and Written Opinion for International Application No. PCT/US2016/060408, dated Mar. 16, 2017, 11 pages.

Lingard, et al., "Investigating the Feasibility of Innovative Technologies to Improve Air Quality Monitoring over the Medium to Long Term", Ricardo Energy & Environment, Oct. 30, 2015, ED 60468 Task 2, Final Version, 95 pages.

* cited by examiner

ATMOSPHERIC SENSOR NETWORK AND ANALYTICAL INFORMATION SYSTEM RELATED THERETO

CROSS-REFERENCE TO RELATED APPLICATIONS

This application is a continuation of U.S. application Ser. No. 16/821,718, filed Mar. 17, 2020, entitled "Atmospheric Sensor Network and Analytical Information System Related Thereto", which is a continuation of U.S. application Ser. No. 15/343,185, filed Nov. 3, 2016, entitled "Atmospheric Sensor Network and Analytical Information System Related Thereto", which claims the benefit of and priority to U.S. Provisional Application No. 62/250,894, filed Nov. 4, 2015, entitled "Atmospheric Sensor Network and Analytical Information System Related Thereto", all of which are incorporated herein by reference.

This application includes material that is subject to copyright protection. The copyright owner has no objection to the facsimile reproduction by anyone of the patent disclosure, as it appears in the Patent and Trademark Office files or records, but otherwise reserves all copyright rights whatsoever.

TECHNICAL FIELD

The present invention relates in general to the field of sensing and data analysis. In particular, the present invention relates to a computerized automated data fusion, atmospheric modeling and prediction of atmospheric chemistry and wind processes, with emphasis on air pollution, and effects of air pollution on health.

STATEMENT OF FEDERALLY FUNDED RESEARCH

None.

BACKGROUND OF THE DISCLOSURE

Air pollution is a 3-dimensional (3D) dynamic process in the global atmospheric system. Considerable air pollution data exists today, collected by many Earth-Observing agencies, but, the ability to derive actionable information from it is limited due to multiple factors including: (i) fragmented, patchy terrestrial networks and limited space-based monitoring which see mostly narrow slices of atmosphere, (ii) data flow from point of observation to end-user typically does not happen on a real-time or near real-time basis, (iii) data is captured in a "snapshot" format, or a mostly two dimensional (2D) approach which constrains the ability to understand air pollution movement and such desirable aspects as tracing air pollution back to its source(s).

Several other factors inhibit the ability to create actionable air pollution information including the fact that most existing data is segmented, hard to access, typically formatted for science research and broad data integration has not been achieved. Specifically, integration of historical data with real time data is not yet generally available; integration of such information with predictive analytical models is not yet generally available, and; integration of air pollution data with corresponding wind data is not yet generally available in addition, only pedestrian approaches to visualizing the data are being taken which greatly limits insight generation. Contrast the latter with taking a strategic visualization approach which tailors information presentation to the specific needs of the audience/customer and captivates.

The U.S. Environmental Protection Agency (EPA), the European Environment Agency (EEA), and the Chinese government are among the main drivers behind existing terrestrial networks. Outside of the U.S. and Europe, very little reliable terrestrial network monitoring exists. The terrestrial-based air quality surveillance system in the U.S. consists of a network of monitoring stations designated as "SLAMS", "NAMS", and "PAMS". SLAMS, or State and Local Air Monitoring Stations, measure ambient concentrations of pollutants (for which standards have been established). NAMS, or National Air Monitoring Stations, are a subset of SLAMS, and are urban area long-term air monitoring networks that provide a systematic, consistent database for air quality comparisons and trends analysis. These sites must meet more stringent siting, equipment type, and quality assurance criteria. PAMS, or Photochemical Monitoring Stations, are also a subset of SLAMS, and monitor volatile organic compounds as ozone precursors during the summer ozone season.

A range of satellites exist today with air pollution data gathering capabilities; including, for example, Terra, Aqua, Aura, MetOp and GOES. The payloads measure certain aspects of air pollution over certain areas of the U.S. and Europe. With their mostly low-earth-orbit designs, data monitoring occurs more on a daily basis versus hourly. Data feeds from these satellites are not proactively fused with respective in-country terrestrial networks. It is therefore a critical need to efficiently ensure the collection of near-real-time on real-time data, together with data gathering from other governmental and commercial atmospheric data sources which aggregate such sources of information Given the above, a comprehensive approach that integrates, synthesizes and innovates is required to appropriately address the air pollution information opportunity. This is a cost-driven opportunity comprised of hundreds of billions of dollars lost annually in such areas as health care and agriculture.

SUMMARY OF THE DISCLOSURE

The present invention provides an atmospheric information network intended to provide real-time or near-real-time air pollution information, fused with wind and weather information to end users on computers and mobile devices. The system is comprised, in part, of a group ("constellation") of low earth orbit satellite-based sensors providing global coverage of the earth, together with one or more ground-based sensor networks, together with one or more mobile sensor networks, all operating to collect near-real-time or real-time data. The system of the present invention further obtains data from governmental, non-governmental, third-party and commercial atmospheric data sources, and performs data fusion operations on data from all such sources to provide enhanced information. Such governmental, non-governmental, third-party and commercial data sources may be satellite-based, or ground-based, or marine/mobile-based, or automotive mobile-based, or end-user hand-held-device mobile-based, or any combination of these.

The system of the present invention further comprises, in part, processes for data reduction, data analysis, correlation of information, data fusion, modeling, reporting of near-real-time or real-time atmospheric conditions of air pollution and wind, and prediction of future atmospheric conditions of air pollution and wind. It is an objective of the present invention to provide a global atmospheric model on a regular periodic basis, incorporating the air pollution information, wind information, and available weather information, gathered from all sources, to create a global picture of air pollution and related atmospheric conditions. The global model may be run in a single processing operation, or may be broken into parts based on regions of the earth or based on other partitioning criteria, and run in parallel or sequential processes in the system's own computing facilities. Alternatively the periodic computation of the model may be run in external computing services provided to the system Resulting information is presented in geospatial and infographic formats on computer or mobile device displays.

The multilateral data sources support multiple feedback pathways, dynamic information updates and information quality improvements based on opportunistically sensed local conditions. The resulting information is further subject to interpretation by means of software algorithms, with presentation of situational awareness information and actionable advisory services to end users.

The system of the present invention is further comprised, in part, of end-users, collectively referred to as a user community. Members of the user community may optionally provide individual health information in the form of health profile data, which are stored in the storage modules of the system of the present invention. Advisories to such end-user are tailored based on relevance to individual end-user health information, providing configurable alert levels and context-sensitive information.

Moreover, users who carry mobile platforms which carry air pollution sensors on-board and are capable of transmitting such data to the system may contribute such sensed air pollution information into the system. Such data is incorporated into the periodic update of the global model.

These and other features of the present invention will become readily apparent upon further review of the following specification and figures.

BRIEF DESCRIPTION OF THE DRAWINGS

The foregoing and other objects, features, and advantages of the disclosure will be apparent from the following description of embodiments as illustrated in the accompanying drawings, in which reference characters refer to the same parts throughout the various views. The drawings are not necessarily to scale, emphasis instead being placed upon illustrating principles of the disclosure.

DETAILED DESCRIPTION OF THE DISCLOSURE

Figure 1:
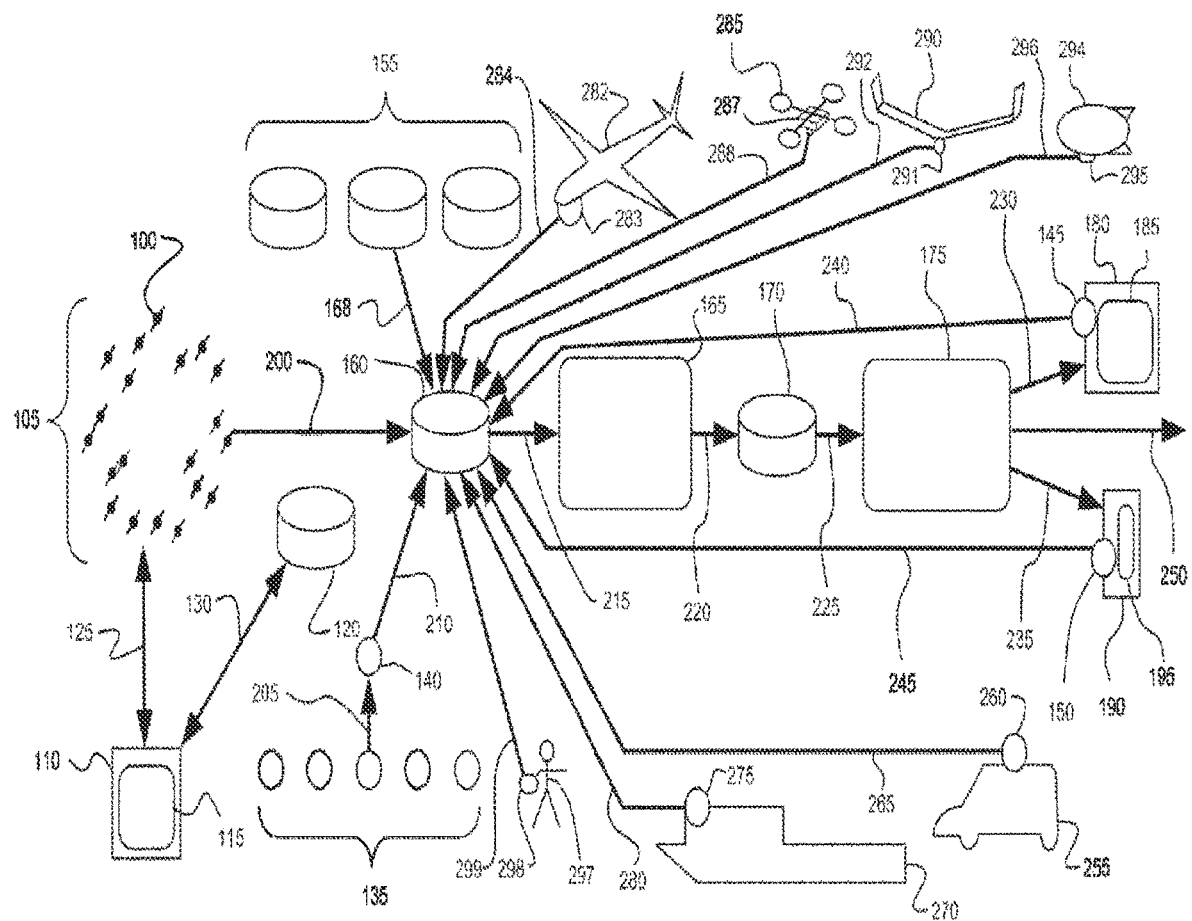
FIG. 1 depicts a system diagram of the major components and data flows of the system.

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the disclosure and do not delimit the scope of the disclosure.

All publications and patent applications mentioned in the specification are indicative of the level of skill of those skilled in the art to which this disclosure pertains. All publications and patent applications are herein incorporated by reference to the same extent as if each individual publication or patent application was specifically and individually indicated to be incorporated by reference.

The present invention will now be described more fully hereinafter with reference to the accompanying figures and drawings, which form a part hereof, and which show, by way of illustration, specific example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems. The following detailed description is, therefore, not intended to betaken in a limiting sense.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

In general, terminology may be understood at least in part from usage in context. For example, terms, such as "and", "or", or "and/or," as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

The present invention is described below with reference to flow charts and operational illustrations of methods and devices. It is understood that each block of the block diagrams or operational illustrations, and combinations of blocks in the block diagrams or operational illustrations, can be implemented by means of analog or digital hardware and computer program instructions. These computer program instructions can be provided to a processor of a general purpose computer, special purpose computer, ASIC, or other programmable data processing apparatus, such that the instructions, which execute via the processor of the computer or other programmable data processing apparatus, implement the functions/acts specified in the system flow chart or operational block or blocks. In some alternate implementations, the functions/acts noted in the blocks can occur out of the order noted in the operational illustrations. For example, two blocks shown in succession can in fact be executed substantially concurrently or the blocks can sometimes be executed in the reverse order, depending upon the functionality/acts involved.

For the purposes of this disclosure a computer readable medium (or computer-readable storage medium/media) stores computer data, which data can include computer program code (or computer-executable instructions) that is executable by a computer, in machine readable form. By way of example, and not limitation, a computer readable medium may comprise computer readable storage media, for tangible or fixed storage of data, or communication media for transient interpretation of code-containing signals. Computer readable storage media, as used herein, refers to physical or tangible storage (as opposed to signals) and includes without limitation volatile and non-volatile, removable and non-removable media implemented in any method or technology for the tangible storage of information such as computer-readable instructions, data structures, program modules or other data. Computer readable storage media includes, but is not limited to, RAM, ROM, EPROM, EEPROM, flash memory or other solid state memory technology, CD-ROM, DVD, or other optical storage, magnetic cassettes, magnetic tape, magnetic disk storage or other magnetic storage devices, or any other physical or material medium which can be used to tangibly store the desired information or data or instructions and which can be accessed by a computer or processor.

For the purposes of this disclosure the term server should be understood to refer to a service point which provides processing, database, and communication facilities. By way of example, and not limitation, the term server can refer to a single, physical processor with associated communications and data storage and database facilities, or it can refer to a networked or clustered complex of processors and associated network and storage devices, as well as operating software and one or more database systems and application software that support the services provided by the server. Servers may vary widely in configuration or capabilities, but generally a server may include one or more central processing units and memory A server may also include one or more mass storage devices, one or more power supplies, one or more wired or wireless network interfaces, one or more input/output interfaces, or one or more operating systems, such as Windows Server, Mac OS X, Unix, Linux, FreeBSD, Android, Chrome OS, or the like.

For the purposes of this disclosure a network should be understood to refer to a network that may couple devices so that communications may be exchanged, such as between a server and a client device or other types of devices, including between wireless devices coupled via a wireless network, for example. A network may also include mass storage, such as network attached storage (NAS), a storage area network (SAN), or other forms of computer or machine readable media, for example A network may include the Internet, one or more local area networks (LANs), one or more wide area networks (WANs), wire-line type connections, wireless type connections, cellular or any combination thereof. Likewise, sub-networks, which may employ differing architectures or may be compliant or compatible with differing protocols, may interoperate within a larger network. Various types of devices may, for example, be made available to provide an interoperable capability for differing architectures or protocols. As one illustrative example, a router may provide a link between otherwise separate and independent LANs.

A communication link or channel may include, for example, analog telephone lines, such as a twisted wire pair, a coaxial cable, full or fractional digital lines including T1, T2, T3, or T4 type lines, Integrated Services Digital Networks (ISDNs), Digital Subscriber Lines (DSLs), Fiber-optic networks, wireless links including satellite links, or other communication links or channels, such as may be known to those skilled in the art. Furthermore, a computing device or other related electronic devices may be remotely coupled to a network, such as via a telephone line or link, for example.

For purposes of this disclosure, a "wireless network" should be understood to couple client devices with a network using some form of radio communications A wireless network may employ stand-alone ad-hoc networks, mesh networks, Wireless LAN (WLAN) networks, cellular networks, or the like A wireless network may further include a system of terminals, gateways, routers, or the like coupled by wireless radio links, or the like, which may move freely, randomly or organize themselves arbitrarily, such that network topology may change, at times even rapidly. A wireless network may further employ a plurality of network access technologies, including Long Term Evolution (LTE), WLAN, Wireless Router (WR) mesh, or 2nd, 3rd, or 4th generation (2G, 3G, or 4G) cellular technology, or the like Network access technologies may enable wide area coverage for devices, such as client devices with varying degrees of mobility, for example.

For example, a network may enable radio frequency (RF) or wireless type communication via one or more network access technologies, such as Global System for Mobile communication (GSM), Universal Mobile Telecommunications System (UMTS), General Packet Radio Services (GPRS), Enhanced Data GSM Environment (EDGE), 3GPP Long Term Evolution (LTE), LTE Advanced, Wideband Code Division Multiple Access (WCDMA), Bluetooth, 802.11b/g/n, or the like. A wireless network may include virtually any type of wireless communication mechanism by which signals may be communicated between devices, such as a client device or a computing device, between or within a network, or the like.

A computing device may be capable of sending or receiving signals, such as via a wired or wireless network, or may be capable of processing or storing signals, such as in memory as physical memory states, and may, therefore, operate as a server. Thus, devices capable of operating as a server may include, as examples, dedicated rack-mounted servers, desktop computers, laptop computers, set top boxes, integrated devices combining various features, such as two or more features of the foregoing devices, or the like. Servers may vary widely in configuration or capabilities, but generally a server may include one or more central processing units and memory. A server may also include one or more mass storage devices, one or more power supplies, one or more wired or wireless network interfaces, one or more input/output interfaces, or one or more operating systems, such as Windows Server, Mac OS X, Unix, Linux, FreeBSD, Android, Chrome OS, or the like.

For purposes of this disclosure, a monitoring (or sensor or user) device may include an instrument such as a sensor, which may further include one or more computing devices capable of sending or receiving signals, such as via a wired or a wireless network. A monitoring device may, for example, include a desktop computer or a portable device, such as a cellular telephone, a smart phone, a display pager, a radio frequency (RF) device, an infrared (IR) device an Near Field Communication (NFC) device, a Personal Digital Assistant (PDA), a handheld computer, a tablet computer, a laptop computer, phablets, intelligent clothing, a set top box, a wearable computer, an integrated device combining various features, such as features of the forgoing devices, or the like.

A monitoring device may vary in terms of capabilities or features. Claimed subject matter is intended to cover a wide range of potential variations. For example, a device may include a numeric keypad or a display of limited functionality, such as a monochrome liquid crystal display (LCD) for displaying text. In contrast, however, as another example, a web-enabled monitoring device may include one or more physical or virtual keyboards, mass storage, one or more gas sensors, thermometers, barometers, fire detectors, accelerometers, one or more gyroscopes, global positioning system (GPS) or other location-identifying type capability, or a display with a high degree of functionality, such as a touch-sensitive color 2D or 3D display, for example.

A monitoring device may include or may execute a variety of operating systems, including a personal computer operating system, such as a Windows, iOS or Linux, or a mobile operating system, such as iOS, Android, Chrome OS, or Windows Mobile, or the like. A monitoring device may include or may execute a variety of possible applications, such as a software application enabling communication with other devices, such as communicating one or more messages, such as via email, communication link, short message service (SMS), or multimedia message service (MMS), including via a network, such as a social network. A monitoring device may also include or execute an application to communicate content, such as, for example, textual content, multimedia content, or the like. A monitoring device may also include or execute an application to perform a variety of possible tasks, such as browsing, searching, displaying various forms of content, including locally stored or streamed video. The foregoing is provided to illustrate that claimed subject matter is intended to include a wide range of possible features or capabilities.

The principles described herein may be embodied in many different forms. The system of the present invention comprises a computing device and configuration software enabling the computing device to capture and store information from isolated and various remote client devices including atmospheric monitoring devices and indicators. The system includes a processor of the computer or other programmable data processing apparatus that collects instrumentation data from a plurality of monitoring instruments. Configuration software provides the means for communicating with a wide variety of disparate instrumentation systems.

Turning to FIGS. 1-11, illustrative embodiments of the system of the present invention are provided. The principal computer processor, server, or combination of devices that comprises hardware programmed in accordance with the special purpose functions herein, referred to for convenience as a programmable logic system, can include a network module, programmable logic module, data extraction module, comparison module, and results module for achieving data correlation, source correlation, geospatial correlation, geospatial value surface mapping, wind and weather data correlation, forward-predictive global air pollution modeling, four-dimensional animation, health correlation, healthcare information fusion, and the like. It should be understood that the engine(s) and modules discussed herein are non-exhaustive, as additional or fewer engines and/or modules may be applicable to the embodiments of the systems and methods discussed. Specific programming in a general computer includes the programmable logic module and results module for generating the data necessary for the functional aspects of the present invention. The process of the present invention may be performed by the programmable logic system and focuses upon processing data to effectuate the logic and sequential approach discussed herein.

Thus, in an exemplary embodiment of the present invention, a system is provided for integrating a computing device into an instrumentation and control system having a programmable logic system adapted for connection to atmospheric sensors and equipment control devices, wherein the computing device is operably connected to the programmable logic system, the computing device having a processor, an area of main memory, and configuration software; operable by the processor when loaded into the main memory, the configuration software having means for reconfiguring the programmable logic system to communicate with the atmospheric sensors and instrumentation control devices; and means for configuring alarms based on the input from the atmospheric sensors signaling pre-determined concentrations of hazardous air pollution components.

It is therefore an embodiment of the present invention to provide a system comprised of a set of hardware components, together with a set of software components, together with data receipt and data delivery processes, together with analytic and presentation processes, and together with information presentation software suitable for operation on conventional computer equipment as well as mobile computer equipment. An atmospheric information network comprised of a group ("constellation") of low earth orbit satellite-based sensors provides global coverage of the earth, together with one or more ground-based sensor networks, together with one or more mobile sensor networks, all operating to collect near-real-time or real-time data, together with data gathering from other governmental, non-governmental, third-party and commercial atmospheric data sources, together with software algorithms and processes for data reduction, data analysis, correlation of information, data fusion, modeling, reporting of near-real-time or real-time atmospheric conditions of air pollution and wind, and prediction of future atmospheric conditions of air pollution and wind. Such information is presented in geospatial and infographic formats on computer or mobile device displays. The multilateral data sources support multiple feedback pathways, dynamic information updates and information quality improvements based on opportunistically sensed local conditions. The resulting information is further subject to interpretation by means of software algorithms, with presentation of situational awareness information and actionable advisory services to end users. Such advisories can be further tailored based on relevance to individual end-user health information, providing configurable alert levels and context-sensitive information. Users who have provided individuals health information profiles which are stored in the system for this purpose, and users who carry mobile platforms which carry air pollution sensors on-board and are capable of transmitting such data to the system, comprise a user community.

In one embodiment, the present invention senses and collects real-time and near-real-time global air pollution data, and correlates, analyzes, transforms, stores, and presents air pollution information based on such data, from sensor networks which are part of the system, as well as incorporating data from external databases and sensor networks operated by others. In another embodiment, the system acts to utilize such data to provide end-users with actionable information and recommendations based in part on general human conditions as well as on specific health profiles of individual end users who have provide their health information to the system for comparative use A further embodiment of the system provides such air pollution information to external governmental, non-governmental, third-party and commercial entities enabling them to integrate such information into their own presentation systems and recommendation processes.

Another embodiment provides near-real-time global satellite-sourced pollution data that is normalized, correlated with terrestrial pollution data and other data, personalized for an end-user and securely delivered to a desktop or mobile device, optionally as a software application service.

Still another embodiment provides near-real-time Global Satellite sourced pollution data with predictive forecast showing normalized, correlated, personalized or end-user specific data as a secure business-to-business service for smart nation integration and/or consumer electronics integration.

Yet another embodiment of this disclosure provides a global near-real-time pollution data system which obtains data from a constellation of satellite and ground station sensors and other sources, and delivers such data over a secure v6 network for commercial consumption that is normalized, correlated and personalized as a business-to-business software application service for mobile communications devices.

There is also an embodiment providing a global near-real-time pollution data system which obtains data from a constellation of satellite and ground station sensors and other sources, normalized, correlated and personalized as business-to-business software application service for insurance data centers, corporate compliance, and national compliance agencies.

Embodiments disclosed herein also provide for a global near-real-time pollution data system which obtains data from a constellation of satellite and ground station sensors and other sources, normalized, correlated and displayed on airline schedule display boards in airports, providing destination air pollution condition reports and predictions.

Additionally, an embodiment herein provides a global near-real-time pollution data system which obtains data from a constellation of satellite and ground station sensors and other sources, normalized, correlated and displayed in the context of urban roadway information displays.

In another embodiment, a global near-real-time pollution data system obtains data from a constellation of satellite and ground station sensors and other sources, normalized, correlated and displayed in the context of weather information displays.

In yet another embodiment, a global near-real-time pollution data system obtains data from a constellation of satellite and ground station sensors and other sources including historical sources, that is normalized, correlated and displayed in the context of real estate information maps.

Turning to FIG. 1, a satellite group ("constellation") 105 of Low-Earth-Orbit satellites comprised of eighteen to twenty-six individual satellites 100 serve as sensor platforms. Each satellite carries a suite of air pollution sensors and measures a set of human-relevant air pollution constituents in the atmosphere as it tracks across the surface of the earth. In one embodiment of the system, each satellite also carries an optical or radio-frequency sounder to provide third-dimensional information. In another embodiment of the system, each satellite also carries a set of weather sensors to provide weather information to complement external weather data sources. These satellites provide complete or nearly complete geospatial coverage over the surface of the earth, and temporal coverage such that each point on the globe is revisited on a schedule rarely exceeding an hour.

Air pollution data is communicated to a database 160 configured to hold untransformed data (termed "L0 data"), and data which has been transformed only once (termed "L1" data), hereinafter referred to as a database of L0 and L1 data.

The sensor instruments on the satellite constellation 105 are managed by means of the satellite sensor administration software 115 running on the satellite sensor administration computer system 110. The satellite sensor administration software 115 transfers data 130 to and from a database 120 of calibration information and testing data, and transfers 125 control signals and calibration adjustment instructions to and from individual satellites 100 to adjust and calibrate sensor functionality.

The system also transfers 168 air pollution data, wind and weather data from external sources held in external databases 155 associated with data collection networks operated by governments, non-governmental organizations, third-party and commercial entities. These data are also stored in the database of L0 and L1 data 160.

In an embodiment of the system, a network of ground-based sensor stations 135, and local data aggregation computer nodes 140 are deployed in selected locations in a network grid on or near the surface of the earth. These sensor stations collect local air pollution data, and this data is transferred 210 to the database of L0 and L1 data 160.

In another embodiment of the system, a network of mobile sensor stations 275 is deployed on ocean-going vessels 270 worldwide. Air pollution data collected by this network is transferred 280 to the database of L0 and L1 data 160, either through forwarding stations which are part of the system, or through forwarding data pathways operated by others.

In another embodiment of the system, a network of automotive mobile sensor stations 260 is deployed on motor vehicles 255. Air pollution data collected by this network is transferred 265 to the database of L0 and L1 data 160, either through forwarding stations which are part of the system, or through forwarding data pathways operated by others.

In another embodiment of the system, a network of mobile aeronautical sensor stations 283 is deployed on aircraft 282. Air pollution data collected by this network is transferred 284 to the database of L0 and L1 data 160, either through forwarding stations which are part of the system, or through forwarding data pathways operated by others.

In another embodiment of the system, a network of mobile aeronautical sensor stations 287 is deployed on unmanned aircraft systems (so-called drones) 285. Air pollution data collected by this network is transferred 288 to the database of L0 and L1 data 160, either through forwarding stations which are part of the system, or through forwarding data pathways operated by others.

In another embodiment of the system, a network of mobile aeronautical sensor stations 291 is deployed on aircraft-like unmanned aircraft systems (so-called drones) designed for long-duration flight 290. Air pollution data collected by this network is transferred 292 to the database of L0 and L1 data 160, either through forwarding stations which are part of the system, or through forwarding data pathways operated by others.

In another embodiment of the system, a network of mobile or tethered aeronautical sensor stations 295 is deployed on balloon-like or lighter-than-air unmanned aircraft systems (so-called aerostat drones) designed for long-duration flight or station-keeping aloft 294. Air pollution data collected by this network is transferred 296 to the database of L0 and L1 data 160, either through forwarding stations which are part of the system, or through forwarding data pathways operated by others.

The system processes air pollution data periodically on a regular cycle, as well as on an ad hoc basis. The analytic software module 165 ingests 215 sets of L0 data or L1 data from the database of L0 and L1 data 160, and passes the data through a sequence of analytic steps. The results of processing may include, but are not limited to, presentable air pollution information on individual parameters, geospatial correlations, temporal correlations, correlations with wind data and other weather processes, incorporation into atmospheric models, forward predictions, information based on synergistic discovery of information patterns, and actionable recommendations. The results of the model processing are validated from time to time against a known set of conditions and outcome. The results of processing are transferred 220 into a database of analyzed information 170, where the information is stored.

Stored air pollution information and other information in the database of analyzed information 170 are transferred into a presentation software module 175. The presentation module may pass the information onward 250 on a bulk basis through an application programming interface ("API") to another entity, such as, for example, a commercial customer, for its use. The presentation software module 175 may alternatively pass the information to a presentation browser-based Web-application 185 displayed in an end-user stationary computer 180, conventional technology by others, or the presentation software module 175 may pass the information to a presentation software mobile app 195 running in a mobile computer/mobile smartphone 190, conventional technology by others. The presentation software module 175 may alternatively pass the information to an electronic billboard, such as, for example, may be operated by a governmental or commercial entity, and visible to the public.

The information passed to the end user may include any of the information types held in the database of analyzed information 170, optionally including actionable information and/or recommendations relevant to the specific end-user, based on his/her health profile.

In another embodiment of the system, the end-user devices (stationary computer 180 and/or mobile computer/mobile smartphone 190 contain air pollution sensor stations 145, 150, built by others may alternatively be used to send data to the database of L0 and L1 data 160. The sensor stations 150 deployment can be on bicycles, balloons, pedestrian transportation, drones, or any other conventional mobile platforms. The presentation browser-based Web-application (in computer 180) or presentation software mobile app (in mobile device 190) sends air pollution measurement data as feedback to the system 240, 245, which is then stored in the database of L0 and L1 data 160. Such data is then included in the next scheduled or ad hoc round of analysis, and serves to improve the quality of local representation of air pollution information Additionally, handheld platform 298, which may comprise a computer 180 or smartphone or tablet device 190 may be deployed in any ambient environment by a system user 297 where in the air pollution observation data and any other ambient environment data may be delivered to data storage 160.

Figure 2:
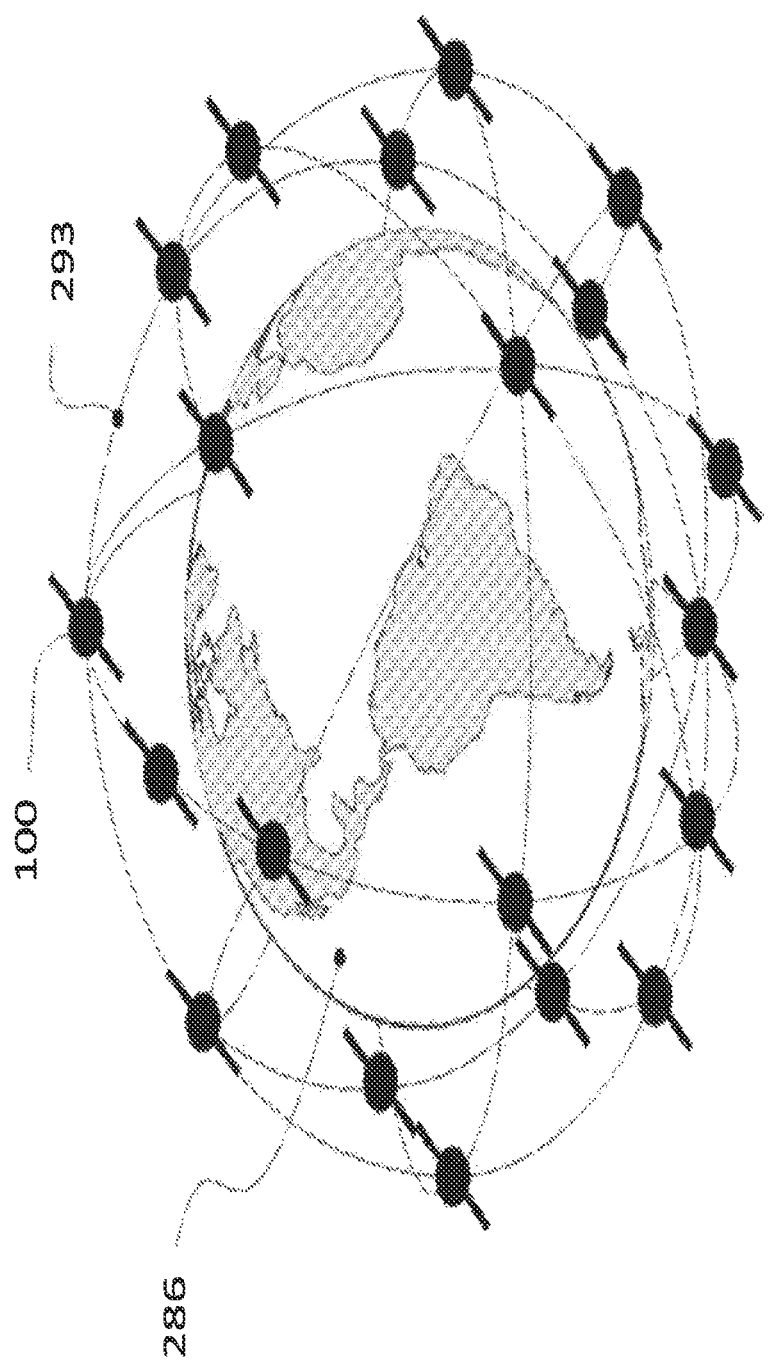
FIG. 2 depicts a notional depiction of the satellite constellation as a data-collection network.

The constellation of satellites is designed to deliver global air pollution data in time increments recognized by the marketplace as real-time or near-real-time. Cost to deliver is minimized while data "freshness" is maximized. Referring to FIG. 2, in one embodiment, the constellation consists of a total of eight satellite orbital planes 293 around the earth 286 with three satellites 100 with sensor stations per plane, and two spares, for a total of twenty-six satellites. The orbital planes are evenly distributed around the earth and arranged in sun-synchronous orbits at an altitude of approximately eight hundred km. In other embodiments, the number of orbital planes may be different, and number of satellites in each orbital plane may also be different.

The system's initial satellite-based sensor instruments provide monitoring and delivery of data on air pollution components, such as ozone, oxides of sulfur, oxides of nitrogen, carbon monoxide, and aerosols. The system is supplemented by additional satellites over the lifetime of the system. Additional air pollution constituent sensors and analytical capabilities are added as satellites launched later are added to the constellation.

Figure 3:
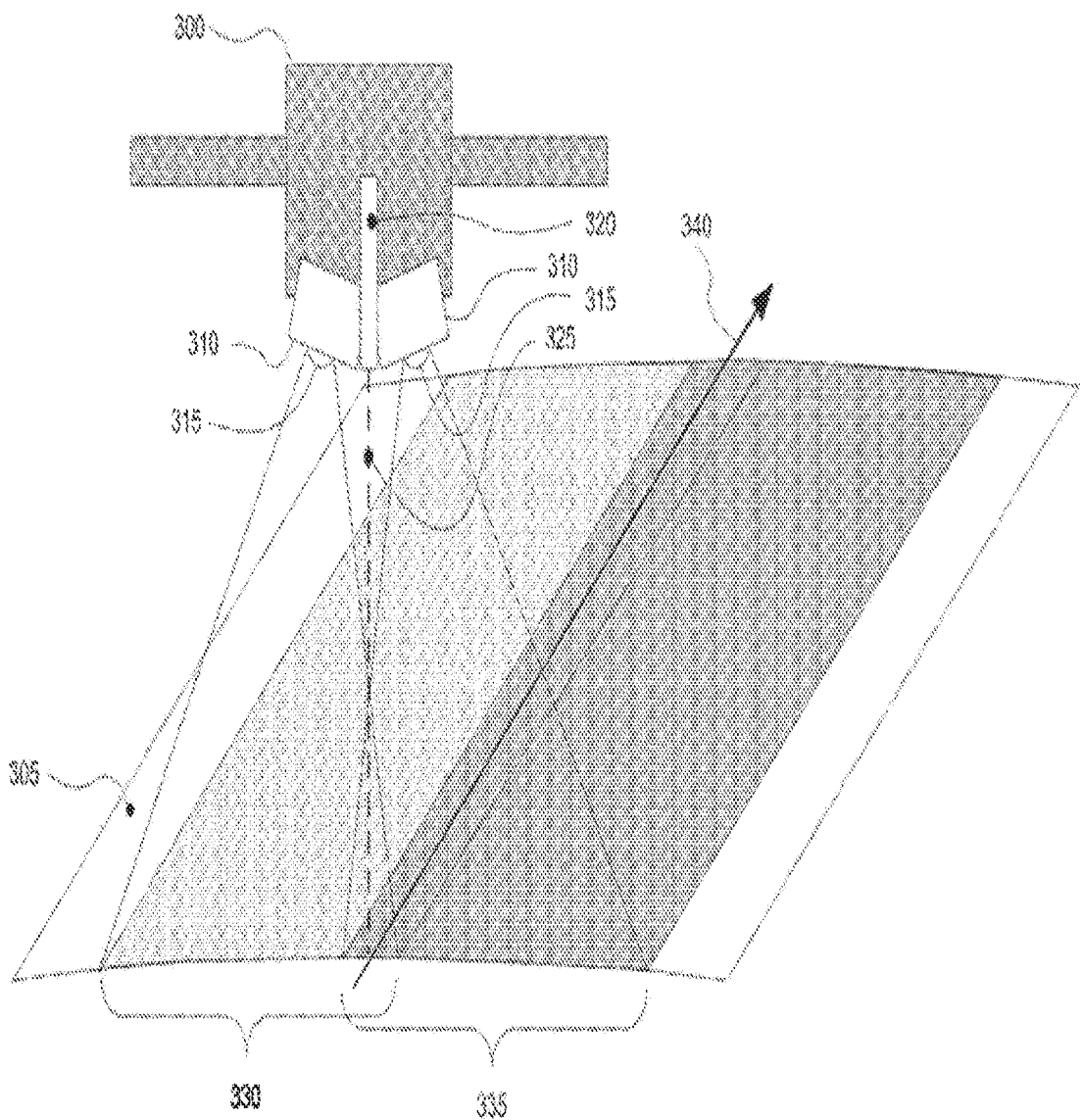
FIG. 3 depicts a notional depiction of a satellite with dual sensor packages and ground tracking.

Referring to FIG. 3, each satellite 300 monitors atmospheric pollutants from ground level through the stratosphere. Multi-spectral sensor instrument packages 310, monitor atmospheric trace gases and aerosols in the ultraviolet, visible, near-infrared, short-wave infrared and thermal-infrared bands through receiving optics 315. This spectrum of bands enables both day-time and night-time monitoring of atmospheric pollutants.

A coverage is the sensing area on the surface of the earth over which the satellite passes as it moves over the surface of the earth 305 along a ground track 340. A coverage swath (or swath) is the sensing width component of the coverage. In one embodiment, each satellite has two swaths for its sensors 330, 335, where the swaths are approximately equally divided, with some overlap.

Each satellite is equipped with an optical or radio-frequency sounder 320 which sends optical or radio-frequency signals directly or indirectly down to the ground and reads and stores the returned echo data received along the optical or radio-frequency beam centerline 325. This device provides additional data to the air pollution data, contributing to a three-dimensional characterization of the air pollution data.

In one embodiment, the two swaths are identical and the total swath is evenly divided 330, 335.

Figure 4:
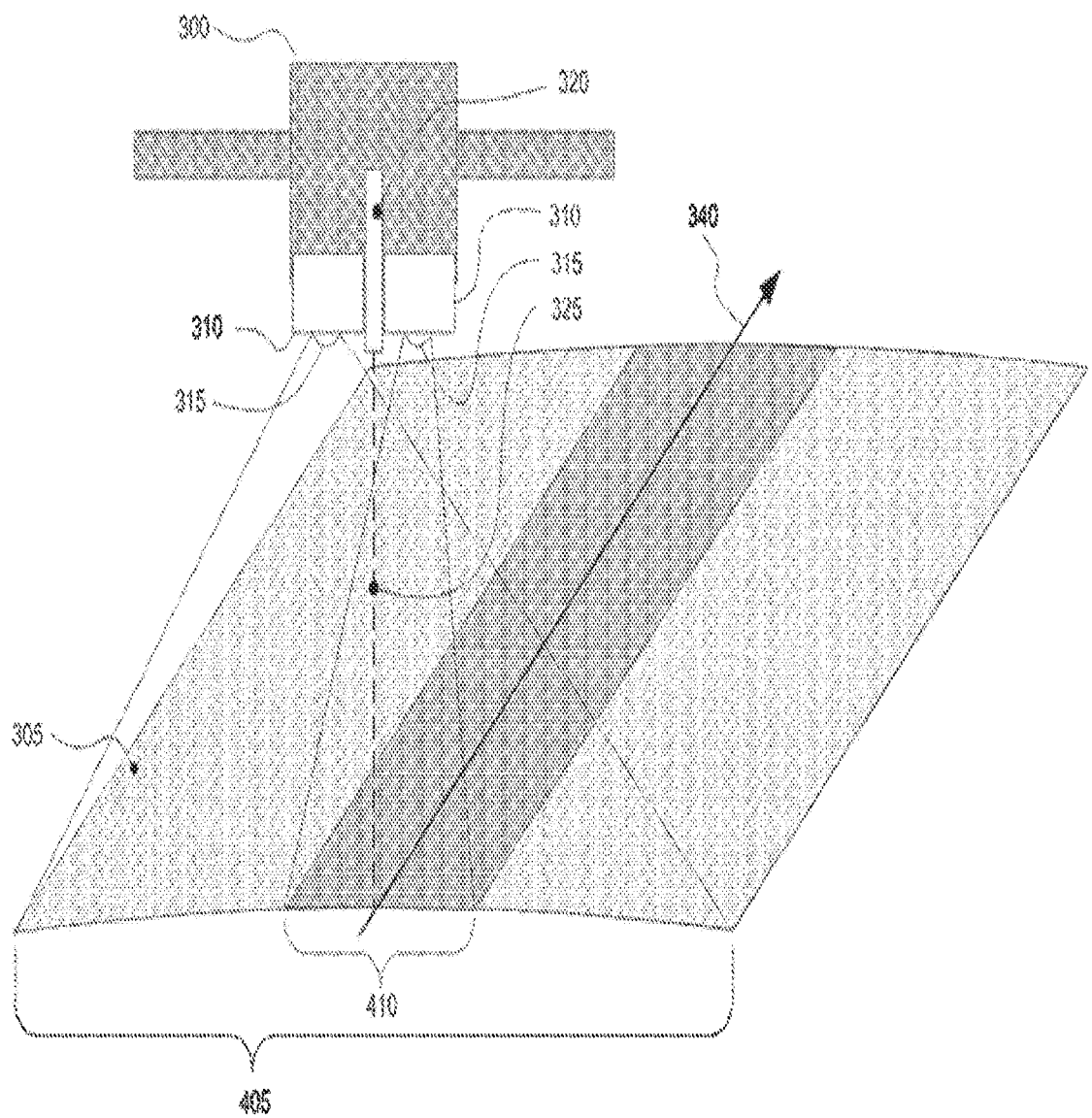
FIG. 4 depicts a notional depiction of a satellite with dual sensor packages and ground tracking, alternative configuration.

Referring to FIG. 4, in another embodiment, the two swaths are different. In this case, as before, each satellite 300 monitors atmospheric pollutants from ground level through the stratosphere. Multi-spectral sensor instrument packages 310 monitor atmospheric trace gases and aerosols through receiving optics 315. Each satellite is equipped an optical or radio-frequency sounder 320 which sends optical or radio-frequency signals directly or indirectly down to the ground and reads and stores the returned echo data received along the optical or radio-frequency beam centerline 325. However in this embodiment, two swaths of differing widths are used, to enable both dedicated air pollution monitoring as well as special event monitoring. A broad swath sensor, for dedicated air pollution monitoring, has a swath in excess of one thousand km 405 and provides a revisit time of one hour or less over any part of the earth's surface. The narrow swath sensor, for special events (e.g. volcanic eruptions, forest fires, etc.) covers a swath in excess of three hundred km 410 and is selectable to one of three regions covering the total broad swath sensor coverage. Each sensor has a ground sampling distance that enables high fidelity resolution. Each sensor provides 3D image and in particular vertical column height information of atmospheric trace gases and aerosols from earth's surface through to stratosphere. The combination of sensors with broad and narrow swaths provides a stereo coverage of the atmospheric columns and unique model validation capability. Other embodiments may utilize different selectable ratios of wide and narrow swaths to achieve additional functionality.

Figure 5:
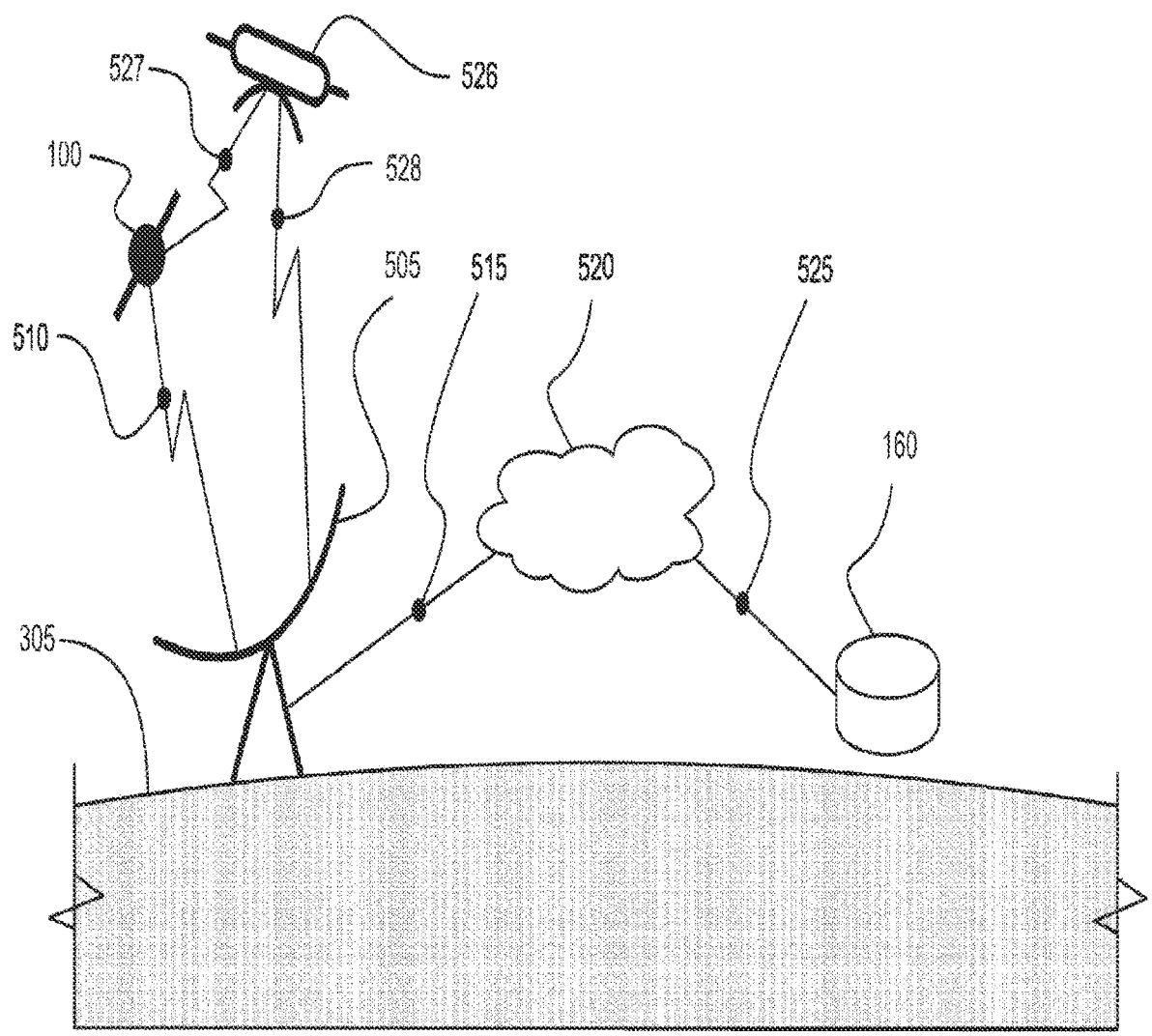
FIG. 5 depicts a notional depiction of satellite sensor data retrieval pathway.

Air pollution sensor data and other data collected by the individual satellites is downloaded to the system database. Referring to FIG. 5, in one embodiment of the system, each satellite 100 collects data and periodically transmits said data by radio communications link 510 to a ground communications station 505 on the earth surface 305. This data is then transferred 515 to commercial services in the Internet 520, and finally delivered 525 to the database of L0 and L1 data 160.

In another embodiment of the system, each satellite 100 collects data and periodically transmits said data by radio communications link 527 to another satellite 526 designed for high-volume data communications, typically, but not exclusively, in geosynchronous orbit around the earth, and therefrom by radio communications link 528 to a ground communications station 505 on the earth surface 305. This data is then transferred 515 to commercial services in the Internet 520, and finally delivered 525 to the database of L0 and L1 data 160.

A significant source of data for the system is data collected by governmental agencies, non-governmental entities, other third-parties and commercial companies. Referring to FIG. 1, such data is typically held in publicly accessible databases or privately held external databases 155. Such data may be accessible through application programming interfaces ("API"s) defined by those entities. The system periodically or asynchronously transfers such data 168, and stores it unaltered in the database of L0 and L1 data 160. Sources of such data include NASA, EPA, and a range of non-U.S. entities which collect air pollution, wind, and weather data through their own data collection sensor networks.

Some such data may originate from stationary ground station networks of sensor stations operated by others which are similar to this system's own 135, 140, or likewise may originate from mobile or marine sensor station networks operated by others and similar to the system's own 255, 260, 270, 275.

Figure 6:
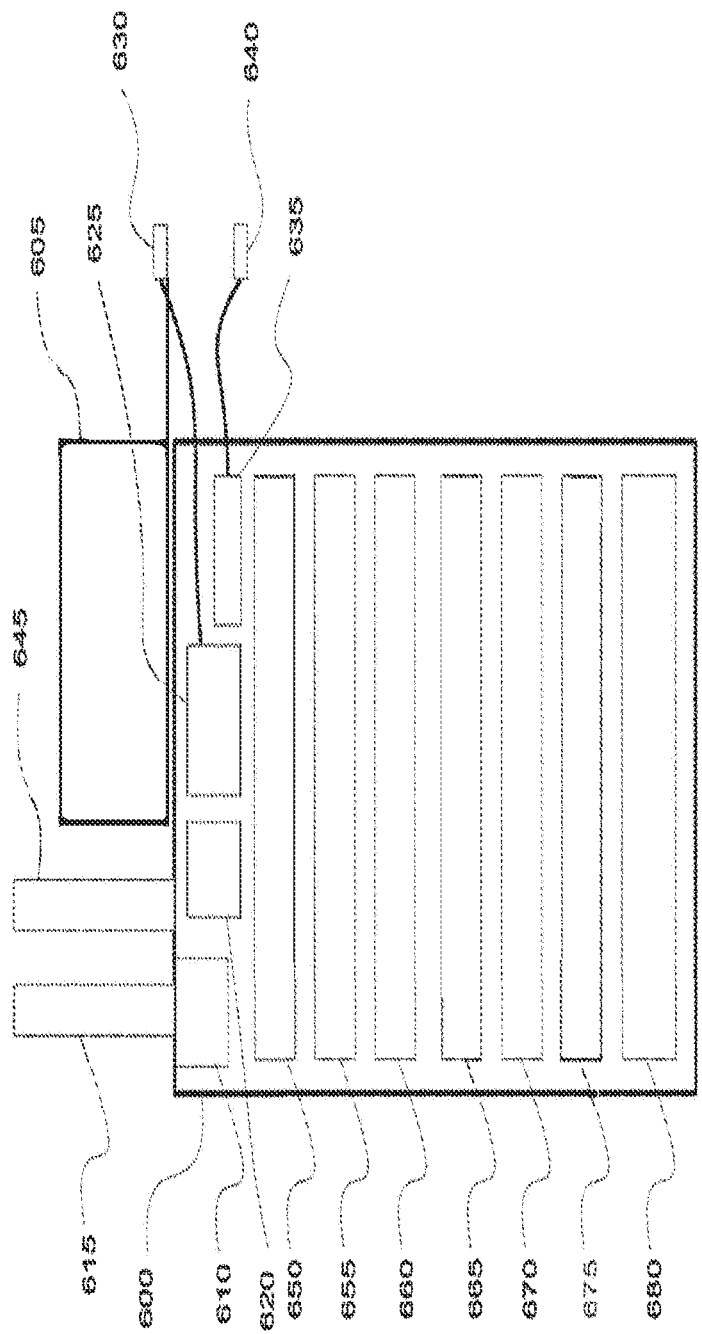
FIG. 6 depicts a national illustration of a ground sensor station package.

In one embodiment of the system, a network of ground-based sensor stations is used to collect local air pollution data. Referring to FIG. 6, each sensor station package is comprised of a hermetically sealed sensor station container 600, with flow controls to admit air for measurement, including an air intake tube 615, an air intake filter 610 to remove particulates, and an air conditioning unit to control air temperature. Additional control equipment include a radio communications module 620, a computer control module 625 and associated software which controls and coordinates operation of all other equipment in the sensor station, and data cable with connector 630 for data export, and an electric power supply module 635 with an electric power cable and connector 640 to supply the entire sensor station.

Each sensor instrument may be conventional technology A particulate sensor probe 645 external to the hermetically sealed case collects air containing particulates for analysis by a particulate analysis sensor 650. The sensor station also contains an ozone sensor 655, a carbon monoxide sensor/analyzer 660, a sulfur dioxide/hydrogen sulfide sensor/analyzer 665, a nitrogen oxide and ammonia sensor/analyzer 670, and a volatile organic compounds sensor/analyzer 675. In one embodiment of the system, other sensors/analyzers 680 may be included, such as radiological sensors. All sensor instruments besides the particulate sensor act on filtered air obtained from inside the hermetically sealed sensor station container 600. Each sensor station may be installed together with a standard weather station 605, and collects information from the weather station in conjunction with its own sensors.

Figure 7:
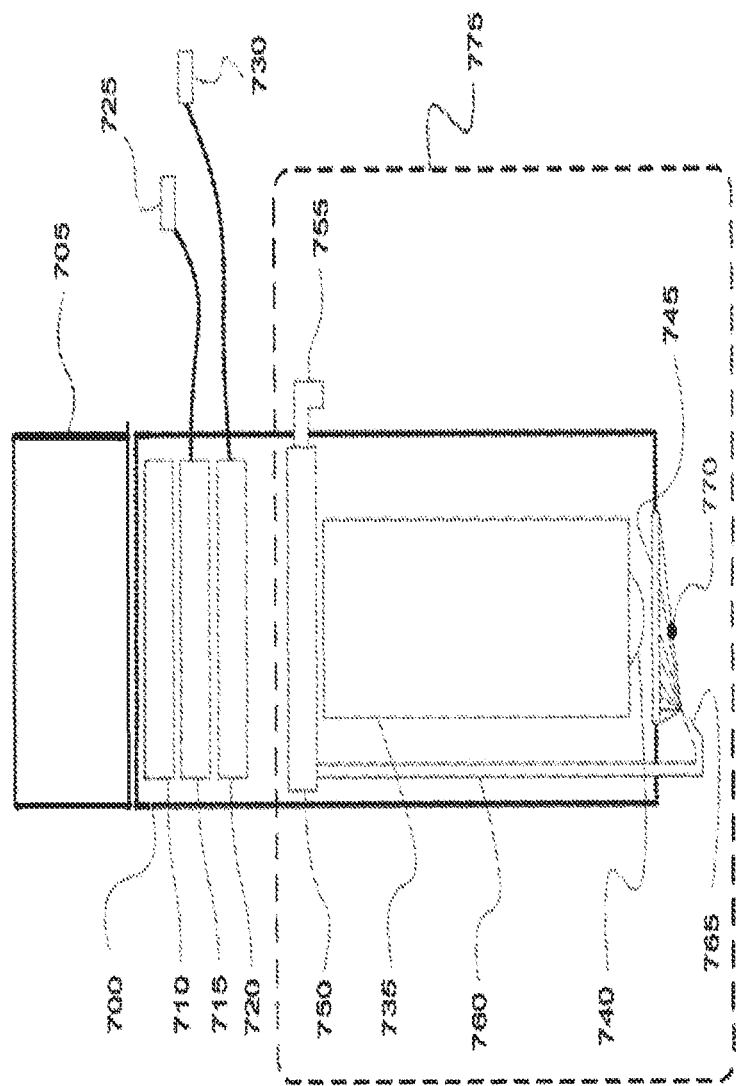
FIG. 7 depicts a notional illustration of an alternative ground sensor station package.

In another embodiment of the system a network of ground-based sensor stations is used to collect local air pollution data, where the sensor stations have somewhat limited capabilities requiring little or no maintenance. Referring to FIG. 7, each such sensor station container 700 is sealed and contains a radio communications module 710, power supply module 715, a power supply cable and connector 725, a computer control module 720, a data cable and connector 730, a photo-spectrometric air pollution sensor instrument 735 and a viewport cleansing system. The photo-spectrometric air pollution sensor instrument 735 relies on clean light-receiving optics 740 through which it obtains measurements. The optics are protected by means of a glass viewing port 745 to the external environment, which may become contaminated or dirty with the passage of time. The glass viewing port 745 is hydrophobic, and also negatively charged to repel particles from its exterior surface. The glass viewing port 745 is periodically cleaned by means of pressurized air drawn in by an air pump 750 through an air intake port 755, and passed through an air delivery tube 760, and sprayed through the airway restriction nozzle 765 onto the external surface of the glass viewing port 770, thereby blowing away contamination and dust which may be accumulated on the surface of the glass viewing port 745.

In another embodiment of the sensor station package, again referring to FIG. 7, the components represented by the photo-spectrometric air pollution sensor instrument 735, the glass viewing port 745, and the viewport cleansing system 750,755,760, 765, 770, is provided as a combined conventional technology 775.

Figure 8:
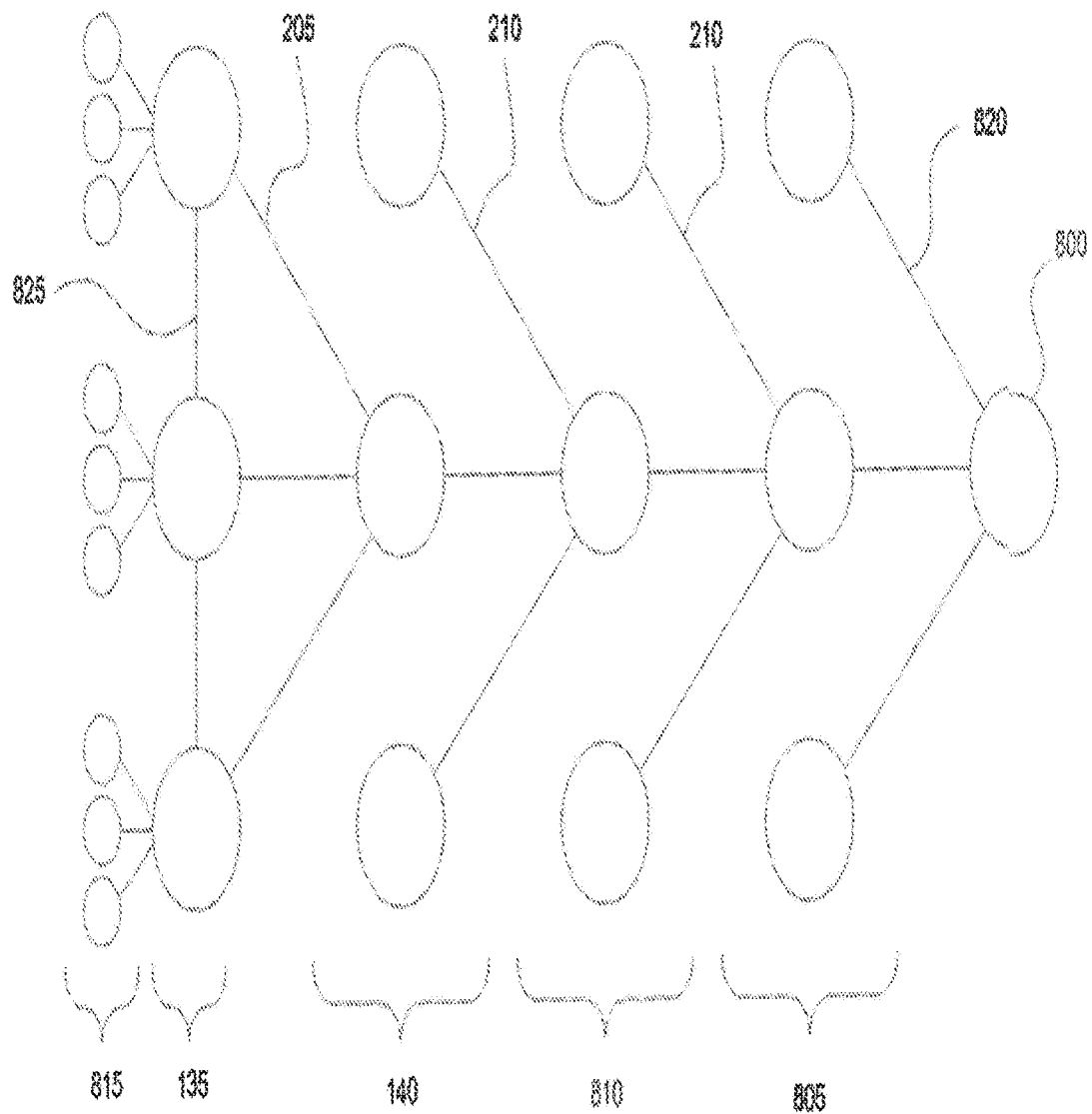
FIG. 8 depicts a notional depiction of the ground-based data-collection network topology.

In one embodiment of the system, the ground sensor network comprised of multiple sensors 815 within multiple sensor stations 135 is deployed as represented abstractly in FIG. 8. The network is comprised of network nodes 815, 135, 140, 810, 805, 800 and data communication lines 205, 210, 820, 825. Data is collected in the multiple sensor stations 135, then transmitted 205 to computers serving as local data aggregation nodes 140, then transmitted 210 to computers serving as regional data aggregation nodes 810, then transmitted 210 to computers serving as national data aggregation nodes 805, then transmitted 820 finally to a global data aggregation node 800 and deposited into the database of L0 and L1 data 160 as shown in FIG. 1.

Operational and control data is also transmitted from higher nodal levels to lower levels, such as from the global node 800 selectively down to the sensor stations 135 and individual instruments 815, as well as to nodes in between 140, 810, 805. Sensor station nodes 135 also transmit peer-to-peer control data between themselves along peer-to-peer data communications pathways between sensor stations 825 enabling local cooperation to enhance and adjust data collection rates and sensor instrument adjustments depending on opportunistic data discoveries by individual sensor stations.

Figure 9:
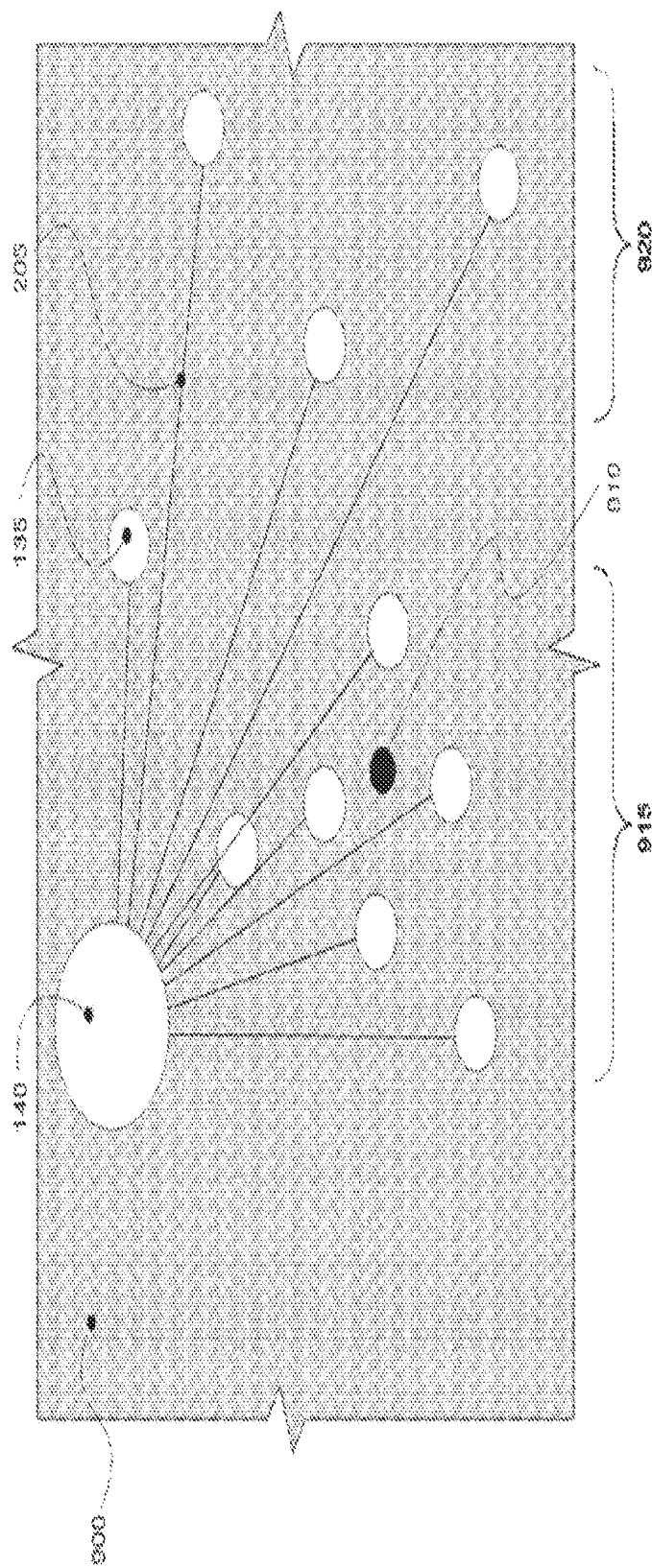
FIG. 9 depicts variable-density sensor grid deployments in ground-based sensor network.

FIG. 9 illustrates features of the ground network sensor station grid from a geospatial perspective. Sensor stations 135 are typically deployed in a geospatial sector 900, and transfer 205 their sensor data to a data aggregation node 140. Where there is a known stationary air pollution source 910, or in dense urban areas, the sensor stations are deployed at a relatively high density, with short distances between stations 915. Where there is no known stationary air pollution source, or in rural areas, the sensor stations are deployed at a relatively low density, with greater distances between stations 920.

Figure 10:
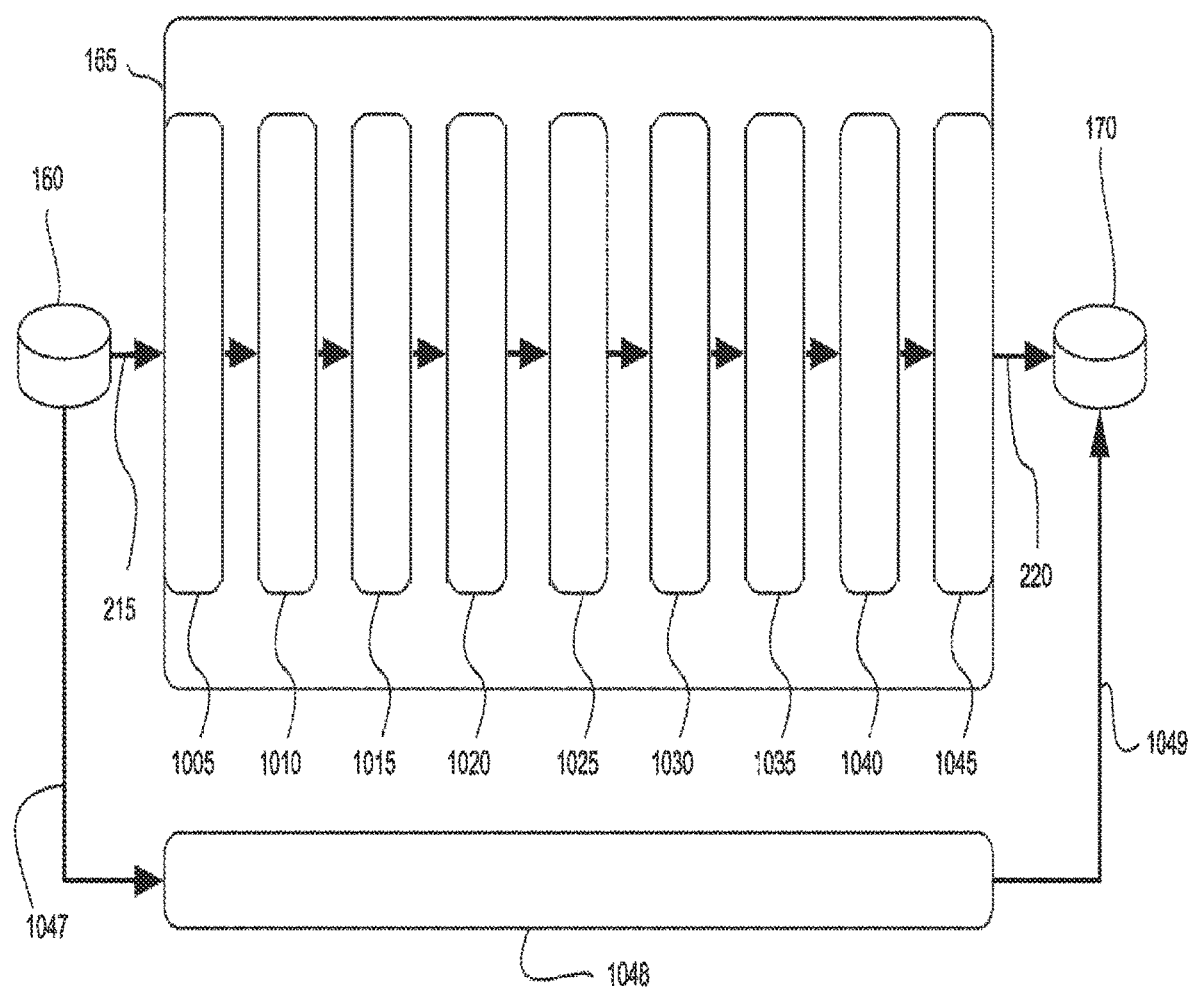
FIG. 10 depicts a schematic view of data reduction, analysis, and data fusion.

Referring to FIG. 10, a schematic diagram illustrating a client device showing an example embodiment of a client device that may be used within the present invention to provide the data reduction and analysis through the system of the present invention. The client device may include many more or less components than those shown in FIG. 10. However, the components shown are sufficient to disclose an illustrative embodiment for implementing the present invention.

Air pollution data, wind, and weather data contained in the database of L0 and L1 data 160 is periodically transferred into the computing device, comprising an analytic software module 165. The periodicity of this activity may vary in various embodiments of the system, however the typical periodicity is hourly, enabling the information produced to have an age of one hour or less at all times. The data reduction and analysis steps may be performed in various different orders, including via a client device, and the resulting information is transferred 220 to the analyzed information database 170.

A computing device comprising an analytic software module includes a processing unit (CPU) in communication with a mass memory 160, 170 via a bus 215, 220. The computing device also includes a power supply, one or more network interfaces, an audio interface, a display, a keypad, an illuminator, an input/output interface, a haptic interface, and an optional global positioning systems (GPS) receiver. The power supply provides power to the computing device. A rechargeable or non-rechargeable battery may be used to provide power. The power may also be provided by an external power source, such as an AC adapter or a powered docking cradle that supplements and/or recharges a battery.

The computing device may optionally communicate with a base station (not shown), or directly with another computing device. One or more network interfaces 215, 220 includes circuitry for coupling the computing device to one or more networks, and is constructed for use with one or more communication protocols and technologies including, but not limited to, global system for communication (GSM), code division multiple access (CDMA), time division multiple access (TDMA), user datagram protocol (UDP), transmission control protocol/Internet protocol (TCP/IP), SMS, general packet radio service (GPRS), WAP, ultra wide band (UWB), IEEE 802.16 Worldwide Interoperability for Microwave Access (WiMax), SIP/RTP, or any of a variety of other wireless communication protocols. The network interface is sometimes known as a transceiver, transceiving device, data transfer, or network interface card (NIC).

A keypad may be implemented and may comprise any input device arranged to receive input from a user. For example, a keypad may include a push button numeric dial, or a keyboard, or may also include command buttons that are associated with selecting and sending images. An illuminator may provide a status indication and/or provide light, and may remain active for specific periods of time or in response to events. The illuminator may also cause light sources positioned within a transparent or translucent case of the client device to illuminate in response to actions.

The computing device also comprises an input/output interface for communicating with external devices, such as a headset, or other input or output devices not shown in FIG. 10. Input/output interfaces can utilize one or more communication technologies, such as USB, infrared, Bluetooth™, or the like.

Optional GPS transceivers can determine the physical coordinates of a computing device on the surface of the Earth, which typically outputs a location as latitude and longitude values. The GPS transceiver can also employ other geo-positioning mechanisms, including, but not limited to, triangulation, assisted GPS (AGPS), E-OTD, CL, SAI, ETA, BSS or the like, to further determine the physical location of the computing device on the surface of the Earth. It is understood that under different conditions, the GPS transceiver can determine a physical location within millimeters for the computing device; and in other cases, the determined physical location may be less precise, such as within a meter or significantly greater distances. In one embodiment, however, the computing device may through other components, provide other information that may be employed to determine a physical location of the device, including for example, a MAC address, IP address, or the like.

The one or more database of L0 and L1 data 160, and of analyzed information 170, or the computing device itself may further comprise mass memory. Mass memory includes a RAM, a ROM, and other storage means. Mass memory illustrates another example of computer storage media for storage of information such as computer readable instructions, data structures, program modules or other data. Mass memory stores a basic input/output system ("BIOS") for controlling low-level operation of computing device. The mass memory also stores an operating system for controlling the operation of computing device. It will be appreciated that this component may include a general purpose operating system such as a version of UNIX, or LINUX™, or a specialized client communication operating system such as Windows Client™, or the Symbian® operating system. The operating system may include, or interface with a Java virtual machine module that enables control of hardware components and/or operating system operations via Java application programs.

Memory further includes one or more data stores, which can be utilized by the computing device to store, among other things, applications and/or other data. For example, data stores may be employed to store information that describes various capabilities of the computing device, including the analytic software module. The information may then be provided to another device based on any of a variety of events, including being sent as part of a header during a communication, sent upon request, or the like. At least a portion of the capability information may also be stored on a disk drive or other storage medium (not shown) within the computing device.

Applications may include computer executable instructions which, when executed by computing device, transmit, receive, and/or otherwise process audio, video, images, and enable telecommunication with a client device. Other examples of application programs include modeling systems, alarm modules, validation modules, task managers, transcoders, database programs, word processing programs, security applications, spreadsheet programs, search programs, and so forth. Applications may further include search client that is configured to send, to receive, and/or to otherwise process an atmospheric or instrumentation data using any known or to be known communication protocols. It should be clear that multiple search clients may be employed. For example, one search client may be configured to enter atmospheric or instrumentation data, where another search client manages results, and yet another search client is configured to manage modeling systems, development of the various alarms or threshold conditions, and the like.

Internal architecture of a computing device(s), computing system, computing platform and the like includes one or more processing units, processors, or processing cores, (also referred to herein as CPUs), which interface with at least one computer bus. Also interfacing with the computer bus are computer-readable medium, or media, network interface, memory, e.g., random access memory (RAM), run-time transient memory, read only memory (ROM), media disk drive interface as an interface for a drive that can read and/or write to media including removable media such as floppy, CD-ROM, DVD, media, display interface as interface for a monitor or other display device, keyboard interface as interface for a keyboard, pointing device interface as an interface for a mouse or other pointing device, and miscellaneous other interfaces not shown individually, such as parallel and serial port interfaces and a universal serial bus (USB) interface.

Memory interfaces with the computer bus so as to provide information stored in memory to the CPU during execution of software programs such as an operating system, application programs, device drivers, and software modules that comprise program code, and/or computer executable process steps, incorporating functionality described herein, e.g., one or more of process flows described herein. The CPU first loads computer executable process steps from storage, e.g., memory, which may include one or more databases 160, computer readable storage medium/media, removable media drive, and/or other storage device. The CPU can then execute the stored process steps in order to execute the loaded computer-executable process steps. Stored data. e.g., data stored by a storage device, can be accessed by CPU during the execution of computer-executable process steps.

Persistent storage, e.g., medium/media, can be used to store an operating system and one or more application programs. Persistent storage can also be used to store device drivers, such as one or more of a digital camera driver, monitor driver, printer driver, scanner driver, or other device drivers, web pages, content files, playlists and other files. Persistent storage can further include program modules and data files used to implement one or more embodiments of the present invention, e.g., listing selection module(s), targeting information collection module(s), and listing notification module(s), the functionality and use of which in the implementation of the present invention are discussed in detail herein.

A network link 215, 220 typically provides information communication using transmission media through one or more networks to other devices that use or process the information. For example, a network link 215, 220 may provide a connection through local network to a host computer or to equipment operated by a Network or Internet Service Provider (ISP). ISP equipment in turn provides data communication services through the public, worldwide packet-switching communication network of networks now commonly referred to as the Internet.

A computer called a server host connected to the Internet hosts a process that provides a service in response to information received over the Internet. For example, server host hosts a process that provides information representing video data for presentation at display. It is contemplated that the components of system can be deployed in various configurations within other computer systems, e.g., host and server.

At least some embodiments of the present invention are related to the use of computer systems for implementing some or all of the techniques described herein. According to one embodiment, those techniques are performed by computer system n response to a processing unit executing one or more sequences of one or more processor instructions contained in memory. Such instructions, also called computer instructions, software and program code, may be read into memory from another computer-readable medium such as a storage device, database 160, 170 or network link. Execution of the sequences of instructions contained in memory causes a processing unit to perform one or more of the method steps described herein. In alternative embodiments, hardware, such as ASIC, may be used in place of or in combination with software. Thus, embodiments of the present invention are not limited to any specific combination of hardware and software, unless otherwise explicitly stated herein.

The signals transmitted over a network link and other networks through a communications interface, carry information to and from the computer system. The computer system can send and receive information, including program code, through the networks, among others, through network link and communications interface. In an example using the Internet, a server host transmits program code for a particular application, requested by a message sent from a computer, through Internet, ISP equipment local network or communications interface. The received code may be executed by the processor as it is received, or may be stored in memory or in a storage device or other non-volatile storage for later execution, or both.

Referring to FIG. 10, in one embodiment of the system, data recently deposited into the database of L0 and L1 data 160 is compared to and correlated with older data, including statically held historical data, by a correlation software module 1005. This correlation is performed by introducing the data into a global atmospheric model, performing calculations to record values of air pollution as correlated with older data. Data of specific air pollution components is also cross-correlated with data of specific other air pollution components.

The resulting correlated data is then passed to a source-correlation module 1010, which correlates air pollution data and wind and weather data obtained from satellites correlated with similar data obtained from ground-based sensors networks, marine networks, automotive mobile networks, and mobile phone/tablet-based sensor networks.

The resulting cross-correlated data is next passed to a geospatial correlation module 1015, and associated with geospatial coordinates.

The resulting geospatially correlated data is then geospatially mapped as air pollution value surface contours in a three-dimensional geospatial model by the geospatial value surface mapper module 1020.

The resulting air pollution value surface contours are then re-evaluated by taking wind data factors and weather data factors into account by the wind and weather data correlator 1025.

The resulting modified resulting air pollution value surface contours are then fed to a forward-predictive global air pollution model 1030, which is run once every hour using the correlated data prepared in the preceding steps.

The resulting information is then transferred into a four-dimensional animation module 1035, which animates the geospatial mapping in three spatial dimensions and a time dimension.

The resulting information is then passed to a health correlation module 1040 which contains data representing health-related criteria pertaining to each air pollution component. This module evaluates the information passed into it for comparison to the said criteria, and generates air pollution density index, values and health-related assessments for each air pollution component. Should any component exceed certain values, the module generates alerts and warnings which are then stored for retrieval by any end-user or end-user agent such as a presentation application or mobile app.

The resulting information is then passed to a health-care information-fusion module 1045 and compared to and fused with statically held health care information and predictive algorithms stored in the database 120 relevant to each of several health-care disciplines, such as pulmonary care and skin care. This module also generates discipline-specific actionable health-care information for immediate benefit to end-users and long-term health benefits.

The resulting geospatially correlated mapping (from 1030), four-dimensional animations (from 1035), and indices and alerts (from 1040), and health-care specific recommendations (from 1045) are transferred 220 to a database of analyzed information 170.

In another embodiment of the system, the data processing and analysis pathway encompassed by block 165 is supplemented by an alternative pathway whereby a third party external to the system may obtain of L0 and L1 data 160 by means of data pathway 1047, processing the data through steps analogous to those comprising block 165, i.e., steps 1005, 1010, 1015, 1020, 1025, 1030, 1035, 1040, and 1045, or some subset thereof comprising step 1048, and deliver the processed and analyzed data through pathway 1049 as information to database 170.

Figure 11:
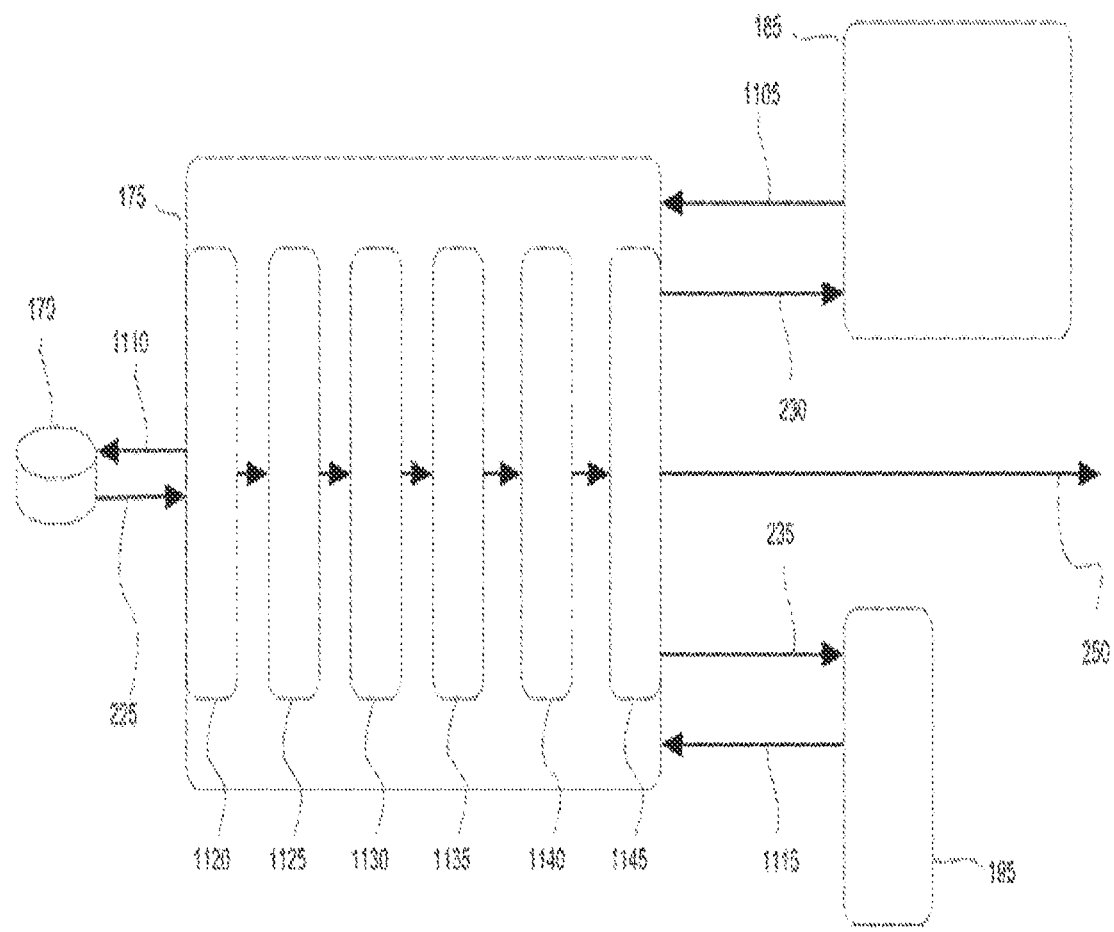
FIG. 11 depicts a schematic view of information presentation.

Referring to FIG. 11, a range of presentation options are provided as services. The operation of the software modules illustrated here may be in the order shown in FIG. 11, or in various embodiments, they may be in different order.

In one embodiment, bulk information is transferred 225 from the database of analyzed information 170 to the information presentation software module 175, prepared for delivery by the presentation information transfer packaging module, the information converted into a format defined by the system's application programming interface ("API") 1145, and transferred 250 to an external entity which may use the information for presentation in its own software, in Web-based, mobile, or other formats of its own. Such transfers may be periodically scheduled, e.g., hourly, or on an ad hoc basis.

In another embodiment, a Web-based application operated by a direct system end-user sends a request for presentation information 1105 to the information presentation software module 175. In turn the information presentation software module 175 sends an information request to the database of transformed information 170. The information returned is passed through one or more of a series of preparation modules 1120, 1125, 1130, 1135, 1140, and 1145 operated in an order appropriate for the specific information request, and transferred 230 to the browser-based Web-application 185 and presented to the end-user on the display screen. In this sequence, the information transferred 225 from the database of analyzed information 170 is formatted for use by the information preparation and formatting software module 1120, then inserted into a geospatial mapping framework 1125. Supplemental information which is non-geospatial in nature but rather infographic in nature is prepared by the infographic information assembly software module 1130. The display page assembly module 1135 obtains a static page framework stored in the database of analyzed information 170, and assembles a page description in hyper-text markup language ("HTML"), and inserts the geospatial information. The infographic overlay assembly module 1140 modifies this page description by overlaying the infographic information, if any, obtained from the infographic information assembly software module 1130, if any, and generates a final version of the HTML file Finally the presentation information transfer packaging module 1145 prepares the file for transfer, by compressing it and adding appropriate header information for transfer using conventional transfer control protocol/Internet protocol (TCP/IP). The file is then transferred 230 to the browser-based Web-application 185 for presentation. The information transferred and presented may contain air pollution information in geospatial format, as well as air pollution information in infographic format, as well as alerts and recommendations for specific actions appropriate to the location of the end-user.

In another embodiment, a mobile app 195 operated by a direct system end-user sends a request for presentation information 1115 to the information presentation software module 175. In turn the information presentation software module 175 sends an information request to the database of analyzed information 170. The information returned is passed through one or more of a series of preparation modules 1120, 1125, 1130, 1135, 1140, and 1145 operated in an order appropriate for the specific information request, and transferred 235 to the presentation software mobile app 195 and presented to the end-user on the display screen. In this sequence, the information retrieved 230 from the database of analyzed information 170 is formatted for use by the information preparation and formatting software module 1120, then inserted into a geospatial mapping framework 1125. Supplemental information which is non-geospatial in nature but rather infographic in nature is prepared by the infographic information assembly software module 1130. The display page assembly module 1135 obtains a size-responsive static page framework suitable for a mobile device display stored in the database of analyzed information 170, and assembles a page description in hyper-text markup language ("HTML"), and inserts the geospatial information. The infographic overlay assembly module 1140 modifies this page description by overlaying the infographic information, if any, obtained from the infographic information assembly software module 1130, if any, and generates a final version of the HTML file. Finally the presentation information transfer packaging module 1145 prepares the file for transfer, by compressing it and adding appropriate header information for transfer using conventional transfer control protocol/Internet protocol (TCP/IP). The file is then transferred 235 to the mobile app 195 for presentation. The information transferred and presented may contain air pollution information in geospatial format, as well as air pollution information in infographic format, as well as alerts and recommendations for specific actions appropriate to the location of the end-user.

Referring to FIG. 11, the browser-based Web application 185 is capable of presenting air pollution information in geospatial format, and also in infographic format. The browser-based Web application 185 is capable of taking, and later editing, information from an end-user, and locally storing the end-users health information formatted as a health profile. The browser-based Web application 185 references this health profile to activate context-sensitive alerts and advisory messages originating from the database of analyzed information 170 which are applicable to the specific end-user.

Referring to FIG. 11, the presentation software mobile app 195 is capable of presenting air pollution information in geospatial format, and also in infographic format. The presentation software mobile app 195 is capable of taking, and later editing, information from an end-user, and locally storing the end-user's health information formatted as a health profile. The presentation software mobile app 195 references this health profile to activate context-sensitive alerts and advisory messages originating from the database of analyzed information 170 which are applicable to the specific end-user.

For the purposes of this disclosure a module is a software, hardware, or firmware (or combinations thereof) system, process or functionality, or component thereof, that performs or facilitates the processes, features, and/or functions described herein (with or without human interaction or augmentation). A module can include sub-modules. Software components of a module may be stored on a computer readable medium for execution by a processor. Modules may be integral to one or more servers, or be loaded and executed by one or more servers. One or more modules may be grouped into an engine or an application.

This disclosure provides illustrative nonlimiting embodiments including an atmospheric information network a group of low earth orbit satellites carrying atmospheric air pollution observation instruments and sensors providing global coverage of the earth, one or more unmanned aerial vehicles carrying atmospheric air pollution observation instruments, air sampling instruments, and sensors; and one or more conventional aircraft or manned aerial vehicles carrying atmospheric air pollution observation instruments, air sampling instruments, and sensors; and one or more terrestrial (ground-based) networks of sensor stations, each station containing atmospheric air pollution observation instruments, air sampling instruments, sensors; and one or more terrestrial-vehicle-based sensor stations, each station containing atmospheric air pollution observation instruments, air sampling instruments, sensors; and one or more human-carried mobile sensor stations, each carrying air sampling instruments and sensors; and a ground-based network of data telemetry transceiver antenna stations, through which space-based data is collected from the aforementioned satellites; and a data telemetry system for passing low earth orbit satellite-originated data through one or more geostationary satellites and re-transmitting said data to the ground-based data telemetry network; and one or more data stores; and software to manage ingestion of atmospheric air pollution data into the data store(s); and one or more data modeling software systems for correlation, analysis of collected data, data fusion, and conversion to actionable information; also may include one or more data modeling software systems for forward-prediction of air pollution; software systems for preparation of presentation of air pollution data in computer-displayable formats; and presentation software for presentation of air pollution data in computer-displayable formats; and one or more Application Programming Interface(s) (APIs) for data exchange with atmospheric information networks and data stores operated by others.

Other nonlimiting embodiments provide an atmospheric information network through which data is moved from sensed location(s), analyzed, and prepared for presentation to presentation software and hardware locations, in real-time or near realtime; and stored in format(s) suitable for real-time or near-real-time access and/or presentation.

Still other embodiments provide an atmospheric information analysis system that correlates air pollution information with other atmospheric information such as wind information, insolation, and thermal information; and correlates air pollution information with static criteria producing actionable information for end users. The network may also enable third parties to retrieve from, analyze, and return analyzed data to the data store facility. Software associated with the data store facility may integrate third party sourced data with other data present in the data store. Other embodiments of the atmospheric information network provide for data conformation to international data standards for air pollution data.

Other embodiments provide a network-based system for providing air pollution observations and information derived therefrom, where the system includes a plurality of low earth orbit satellites carrying atmospheric air pollution observation instruments providing global coverage of the earth to obtain air pollution observation data; a plurality of manned or unmanned aerial vehicles carrying atmospheric air pollution observation instruments to obtain air pollution observation data; a plurality of terrestrial sensor stations containing atmospheric air pollution observation instruments to obtain air pollution observation data; a data storage facility to store the obtained air pollution data; data modeling software for analysis and conversion of atmospheric air pollution observations into end-user data and information; and a data delivery platform for providing end-user data and information.

Additionally the system may provide that the low-earth orbit satellites are operated in sun-synchronous positions. The low-earth orbit satellites, the aerial vehicles and the terrestrial sensor stations may acquire weather data along with the air pollution observation data. At least one of the low-earth satellites may provide high-volume data communications. The terrestrial sensor stations containing atmospheric air pollution observation instruments may be hand-held platforms that may obtain and receive air pollution observation data. Sensor stations containing atmospheric air pollution observation instruments may be motorized terrestrial vehicles or aquatic-surface based crafts. Various communication transmission links to provide air pollution observation data to the data storage facility. The data modeling software provides forward-prediction of air-pollution. The system may include a software module for displaying computer presentation of air pollution observations. The data delivery platform may be a software application service.

Another nonlimiting embodiment is a method of providing air pollution observation services to an end-user that includes acquiring air pollution observation data from a group of low earth orbit satellites carrying atmospheric air pollution observation instruments and sensors providing global coverage of the earth, acquiring air pollution observation data from a plurality of manned or unmanned aerial vehicles carrying atmospheric air pollution observation instruments, acquiring air pollution observation data from a plurality of terrestrial sensor stations containing atmospheric air pollution observation instruments, storing the obtained air pollution data in a data storage facility, analyzing the acquired data with data modeling software to obtain atmospheric air pollution end-user specific data, and delivering the end-user data to an end-user platform.

In other embodiment the method may include operating the low-earth orbit satellites in sun-synchronous positions, or acquiring weather data using the low-earth orbit satellites, the aerial vehicles and the terrestrial sensor stations. The method may provide high-volume data communications with at least one of the low earth orbit satellites or acquiring air pollution data from a handheld sensor station or mobile device that may obtain and receive air pollution observation data. Atmospheric air pollution observations may be acquired from sensor stations fixed to a motorized terrestrial vehicle or water craft Embodiments of the method may provide for delivery of forward-prediction of air-pollution conditions to an end-user as well as a computer presentation of air pollution observations. Software application services with formatted data may be delivered to the end-user platform.

In yet more nonlimiting embodiments a computer program product embodied in non-transitory computer readable media is provided, the computer program product adapted to execute a process to provide air pollution observation data and information for delivery to an end-user platform, the process comprising processing data acquired from a plurality of sensors associated with a plurality of low earth orbit satellites carrying atmospheric air pollution observation instruments, a plurality of manned or unmanned aerial vehicles carrying atmospheric air pollution observation instruments to obtain air pollution observation data, and a plurality of terrestrial sensor stations containing atmospheric air pollution observation instruments to obtain air pollution observation data; the process further comprising storing the obtained air pollution data in a data storage facility; processing the air pollution data through data modeling software for analysis and conversion into end-user data and information; and delivering the end-user data and information to the end-user platform.

Other embodiments of the program include end-user data and information that is personalized to an end-user. The end-user data and information may be delivered over a secure network. Processing the air pollution data may include incorporating atmospheric observation data from governmental and third-party sources. End-user platforms may include, but are not limited to software application programs, web applications, stand-alone applications, mobile-device applications, and Application Programming Interfaces. The end-user specific data and information may be formatted to display in a geospatial mapping presentation. End-user specific data and information may be delivered in response to a delivery request from an end-user platform. The process of the computer program product may deliver air pollution information in geospatial format, in infographic format, as information-based alerts, as recommendations appropriate for end-user specific locations, or as recommendations appropriate to end-user specific requests. The computer program product may acquire air pollution data from a sensor associated with the end-user platform.

Other nonlimiting embodiments disclosed herein include a method of providing air pollution observations to an end-user platform from a network database that includes storing authorization information and end-user platform specific information within the end-user platform and storing the authorization information and end-user platform specific information within a network database. If the authorization information stored in the network database agrees with the authorization information provided in a request from the end-user platform then end-user-specific air pollution data and information is delivered to the end-user platform from the network database and the end-user specific air pollution data and information is updated on the end-user platform.

Other embodiments of the method provide that air pollution observations in the network database are acquired from a plurality of low earth orbit satellites carrying atmospheric air pollution observation instruments, a plurality of manned or unmanned aerial vehicles carrying atmospheric air pollution observation instruments, and a plurality of terrestrial sensor stations containing atmospheric air pollution observation instruments. The acquired air pollution data in the network database may be processed through data modeling software for analysis and conversion into end-user-specific data and information. The air pollution observations in the network database may be acquired from governmental, non-governmental and third-party sources. The end-user specific platform information delivered may be an end-user health profile. The delivered end-user specific air pollution observations may be context specific information from the network database that is based on an end-user health profile. Context specific information based on an end-user health profile stored may be displayed on the end-user platform along with air pollution observations delivered from the network database. Air pollution observations may be delivered to the end-user platform on a regular periodic basis. Delivering end-user specific air pollution observations may also include forward predictions of future atmospheric and air pollution conditions. A sensor associated with the end-user platform may provide air pollution observation data to the network database.

Those skilled in the art will recognize that the methods and systems of the present invention may be implemented in many manners and as such are not to be limited by the foregoing exemplary embodiments and examples. Furthermore, the embodiments of methods presented and described as figures or charts in this disclosure are provided by way of example in order to provide a more complete understanding of the technology. Disclosed methods are not limited to the operations and logical flow presented herein. Alternative embodiments are contemplated in which the order of the various operations is altered and in which sub-operations described as being part of a larger operation are performed independently. While various embodiments have been described for purposes of this disclosure, such embodiments should not be deemed to limit the teaching of this disclosure to those embodiments. Various changes and modifications may be made to the elements and operations described above to obtain a result that remains within the scope of the systems and processes described in this disclosure.

What is claimed is:

1. A computer program product embodied in non-transitory computer readable media, the computer program product adapted to execute a process comprising:
    receiving, from one or more sensors, one or more databases, or any combination thereof, atmospherics data comprising:
        i) global atmospherics data spanning from ground level through the stratosphere providing global coverage of the earth; and ii) local atmospherics data collected throughout at least a portion of a particular vertical column of the earth's atmosphere;

receiving, from an end-user, information concerning specific needs of the end-user;

processing the received atmospherics data to correlate the received atmospherics data and to derive, by analysis of the correlated atmospherics data and the information concerning specific needs of the end-user, at least one of actionable information, alerts, advisories, and recommendations specific to the end-user;

comparing and fusing the received atmospherics data with statistically held health-care information and predictive algorithms relevant to health-care disciplines;

generating, based on the comparison and fusing, discipline-specific actionable health-care information; and delivering, to the end-user, the discipline-specific actionable health-care information and the at least one of actionable information, alerts, advisories, and recommendations specific to the end-user.

2. The computer program product of claim 1, wherein the received atmospherics data comprises air pollution information, wind information, insolation, thermal information, or any combination thereof.

3. The computer program product of claim 1, wherein the received atmospherics data is at least partially acquired from governmental, non-governmental and third-party sources.

4. The computer program product of claim 1, wherein the information concerning the specific needs of the end-user comprises any one or combination of the following: a location of the end-user, health-related criteria relevant to the end-user, pollution-related criteria relevant to the end-user, and one or more criteria of an end-user request.

5. The computer program product of claim 1, wherein correlating the received atmospherics data comprises normalizing the received atmospherics data for comparative use.

6. The computer program product of claim 1, wherein correlating the received atmospherics data comprises correlating a first type of atmospherics data contained in the received atmospherics data with a second type of atmospherics data contained in the received atmospherics data.

7. The computer program product of claim 6, wherein the first type of atmospherics data is the global atmospherics data and the second type of atmospherics data is the local atmospherics data.

8. The computer program product of claim 6, wherein the first type of atmospherics data is atmospherics data received from a first of the one or more sensors and the second type of atmospherics data is atmospherics data received from a second of the one or more sensors.

9. The computer program product of claim 6, wherein the first type of atmospherics data is atmospherics data received from the one or more sensors and the second type of atmospherics data is atmospherics data received from the one or more external databases.

10. The computer program product of claim 6, wherein the first type of atmospherics data is air pollution observations data and the second type of atmospherics data includes at least one of wind, weather, insolation, and thermal data.

11. The computer program product of claim 1, wherein correlating the received atmospherics data comprises correlating the received atmospherics data according to the time at which it was collected and/or the time at which it was received by the computer program product.

12. The computer program product of claim 1, wherein correlating the received atmospherics data comprises correlating the received atmospherics data with associated geospatial coordinates of each.

13. The computer program product of claim 1, wherein correlating the received atmospherics data comprises correlating the received atmospherics data with historical atmospherics data.

14. The computer program product of claim 1, wherein correlating the received atmospherics data comprises correlating the received atmospherics data with corresponding information concerning specific needs of the end-user.

15. The computer program product of claim 1, wherein the at least one of actionable information, alerts, advisories, and recommendations specific to the end-user comprises forward predictions of future atmospheric conditions.

16. The computer program product of claim 1, wherein the at least one of actionable information, alerts, advisories, and recommendations specific to the end-user is selected from a list consisting of: i) information in geospatial format, ii) information in infographic format, iii) information-based alerts, iv) recommendations appropriate for end-user specific locations, and v) recommendations appropriate for end-user specific requests.

17. The computer program product of claim 1, wherein the global atmospherics data and the local atmospherics data are processed periodically on a regular cycle and on an ad hoc basis.

18. The computer program product of claim 1, wherein the at least one of actionable information, alerts, advisories, and recommendations specific to the end-user is delivered to the end-user on an ad hoc basis or a regular periodic basis or upon request by the end user.

19. The computer program product of claim 1,
wherein the computer program product comprises a health correlation module which contains data representing health-related criteria pertaining to atmospheric components; and
wherein the step of deriving comprises comparing, via the health correlation module, the correlated atmospherics data with the health-related criteria to generate health-related assessments for each atmospheric component.

* * * * *